(12) United States Patent
Sakano

(10) Patent No.: US 10,777,602 B2
(45) Date of Patent: Sep. 15, 2020

(54) PIXEL CIRCUIT

(71) Applicant: SONY SEMICONDUCTOR SOLUTIONS CORPORATION, Kanagawa (JP)

(72) Inventor: Yorito Sakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/410,947

(22) Filed: May 13, 2019

(65) Prior Publication Data

US 2019/0333958 A1 Oct. 31, 2019

Related U.S. Application Data

(63) Continuation of application No. 15/633,587, filed on Jun. 26, 2017, now Pat. No. 10,319,777, which is a continuation of application No. 14/906,616, filed as application No. PCT/JP2014/003788 on Jul. 17, 2014, now Pat. No. 9,721,981.

(30) Foreign Application Priority Data

Aug. 2, 2013 (JP) .................................. 2013-161348

(51) Int. Cl.
*H01L 27/146* (2006.01)
*H04N 5/355* (2011.01)
*H04N 5/3745* (2011.01)

(52) U.S. Cl.
CPC .... *H01L 27/14643* (2013.01); *H01L 27/1461* (2013.01); *H01L 27/14603* (2013.01); *H01L 27/14607* (2013.01); *H01L 27/14612* (2013.01); *H01L 27/14636* (2013.01); *H04N 5/3559* (2013.01); *H04N 5/37452* (2013.01)

(58) Field of Classification Search
CPC ......... H01L 27/14603; H01L 27/14643; H01L 27/14612
See application file for complete search history.

(56) References Cited

U.S. PATENT DOCUMENTS

2013/0182159 A1* 7/2013 Wada ................ H01L 27/14603
348/294

\* cited by examiner

*Primary Examiner* — Thomas L Dickey
(74) *Attorney, Agent, or Firm* — Sheridan Ross P.C.

(57) ABSTRACT

A pixel circuit includes a floating diffusion layer of a first conductivity-type between a drain/source of a second conductivity-type and a source/drain of the second conductivity-type. The source/drain and the drain/source touch the floating diffusion layer. A cathode of a photoelectric converter is electrically connected to the floating diffusion layer. An anode of the photoelectric converter touches the cathode. The cathode is of the first conductivity-type and the anode is of the second conductivity-type.

6 Claims, 23 Drawing Sheets

| FD SELECTION SIGNAL SEL_F1 | OPERATION OF AMPLIFYING TRANSISTOR |
|---|---|
| HIGH LEVEL | STORE CHARGE IN FD (OFF STATE) |
| MIDDLE LEVEL | AMPLIFY VOLTAGE ACCORDING TO AMOUNT OF STORED CHARGE AND OUTPUT AMPLIFIED VOLTAGE (ON STATE) |
| LOW LEVEL | RELEASE STORED CHARGE (RESET) |

| FD SELECTION SIGNAL SEL_F1 | OPERATION OF AMPLIFYING TRANSISTOR |
|---|---|
| HIGH LEVEL | AMPLIFY VOLTAGE ACCORDING TO AMOUNT OF STORED CHARGE AND OUTPUT AMPLIFIED VOLTAGE (ON STATE) |
| MIDDLE LEVEL | STORE CHARGE IN FD (ON STATE) |
| LOW LEVEL | RELEASE STORED CHARGE (RESET) |

PIXEL CIRCUIT

CROSS REFERENCE TO RELATED APPLICATIONS

This application is a continuation of U.S. patent application Ser. No. 15/633,587, filed Jun. 26, 2017, which is a continuation of U.S. patent application Ser. No. 14/906,616, filed Jan. 21, 2016, now U.S. Pat. No. 9,721,981, which is a national stage application under 35 U.S.C. 371 and claims the benefit of PCT Application No. PCT/JP2014/003788 having an international filing date of Jul. 17, 2014, which designated the United States, which PCT application claimed the benefit of Japanese Patent Application No. 2013-161348 filed Aug. 2, 2013, the disclosures of which are incorporated herein by reference in their entirety.

TECHNICAL FIELD

The present technology relates to imaging devices, and in particular, to an imaging device for use in photon counting, etc.

BACKGROUND ART

For capturing images, an imaging device that converts light into an electric signal has been often used. In general, an imaging device includes multiple pixels and analog-to-digital (A/D) converters. Each pixel includes a photoelectric converter such as a photodiode, a floating diffusion layer, and an amplifying transistor. In the pixel, the photoelectric converter converts light into an electric charge. The floating diffusion layer stores the charge to generate a signal voltage on the basis of a relationship represented by the expression Q=CV. The signal voltage is amplified by the amplifying transistor. The A/D converter converts an analog signal representing the amplified signal voltage into a digital signal. In the expression, Q represents the amount of charge produced by conversion in the photoelectric converter, C represents the capacitance of the floating diffusion layer, and V represents a signal voltage.

In the imaging device having the above-described configuration, a sufficient decrease in capacitance C of the floating diffusion layer sufficiently increases a signal voltage per photon than noise. This makes it possible to determine whether or not one photon is incident. A photon counting imaging device that counts the number of photons and uses the counted number as an image signal has been proposed (e.g., see PTL 1). The photon counting imaging device realizes an extremely high signal-to-noise (S/N) ratio because it is able to completely eliminate random noise and fixed pattern noise caused by analog signal processing.

CITATION LIST

Patent Literature

PTL 1: JP 2011-71958 A

SUMMARY

Technical Problem

In the above-described related art, it may be difficult to expand a dynamic range. In general, as the capacitance C is increased, the amount of charge that can be stored by the floating diffusion layer increases, so that a detectable range of light intensity (so-called "dynamic range") can be broadened. However, because of the relationship of Q=CV, as the capacitance is increased, a conversion efficiency (=1/C) at which the amount Q of charge according to the amount of received light is converted into a signal voltage V decreases, thus decreasing a signal voltage per photon. This may make it impossible to determine whether or not one photon is incident. Therefore, in the above-described related art, the dynamic range may not be expanded.

Solution to Problem

The present technology has been made in view of the above-described circumstances. It is desirable to expand a dynamic range in a photon counting imaging device.

Advantageous Effects of Invention

The present technology is made by solving the above-described problems, an aspect thereof is a pixel circuit including a floating diffusion layer of a first conductivity-type between a drain/source of a second conductivity-type and a source/drain of the second conductivity-type, the source/drain and the drain/source touching the floating diffusion layer; a cathode of a photoelectric converter electrically connected to the floating diffusion layer, the cathode being of the first conductivity-type; an anode of the photoelectric converter touching the cathode, the anode being of the second conductivity-type.

The present technology has an excellent advantage in that in a photon counting imaging device, a dynamic range can be expanded while maintaining a conversion efficiency.

DESCRIPTION OF EMBODIMENTS

Embodiments of the present technology are described below in the following order:

1. First embodiment (example in which amplifying transistors are connected in series to one photoelectric converter, with multiple charge storage units provided for them);

2. Second embodiment (example in which amplifying transistors are connected in parallel to one photoelectric converter, with multiple charge storage units provided for them);

3. Third embodiment (example in which a reset transistor is disposed for one photo-electric converter, with multiple charge storage units provided for it);

4. Fourth embodiment (example in which floating diffusion layers are separated, with multiple charge storage units provided for one photoelectric converter); and 5. Fifth embodiment (example in which floating diffusion layers and n+ layers are separated, with multiple charge storage units provided for one photoelectric converter).

1. First Embodiment

Example of Configuration of Imaging Device

Figure 1:
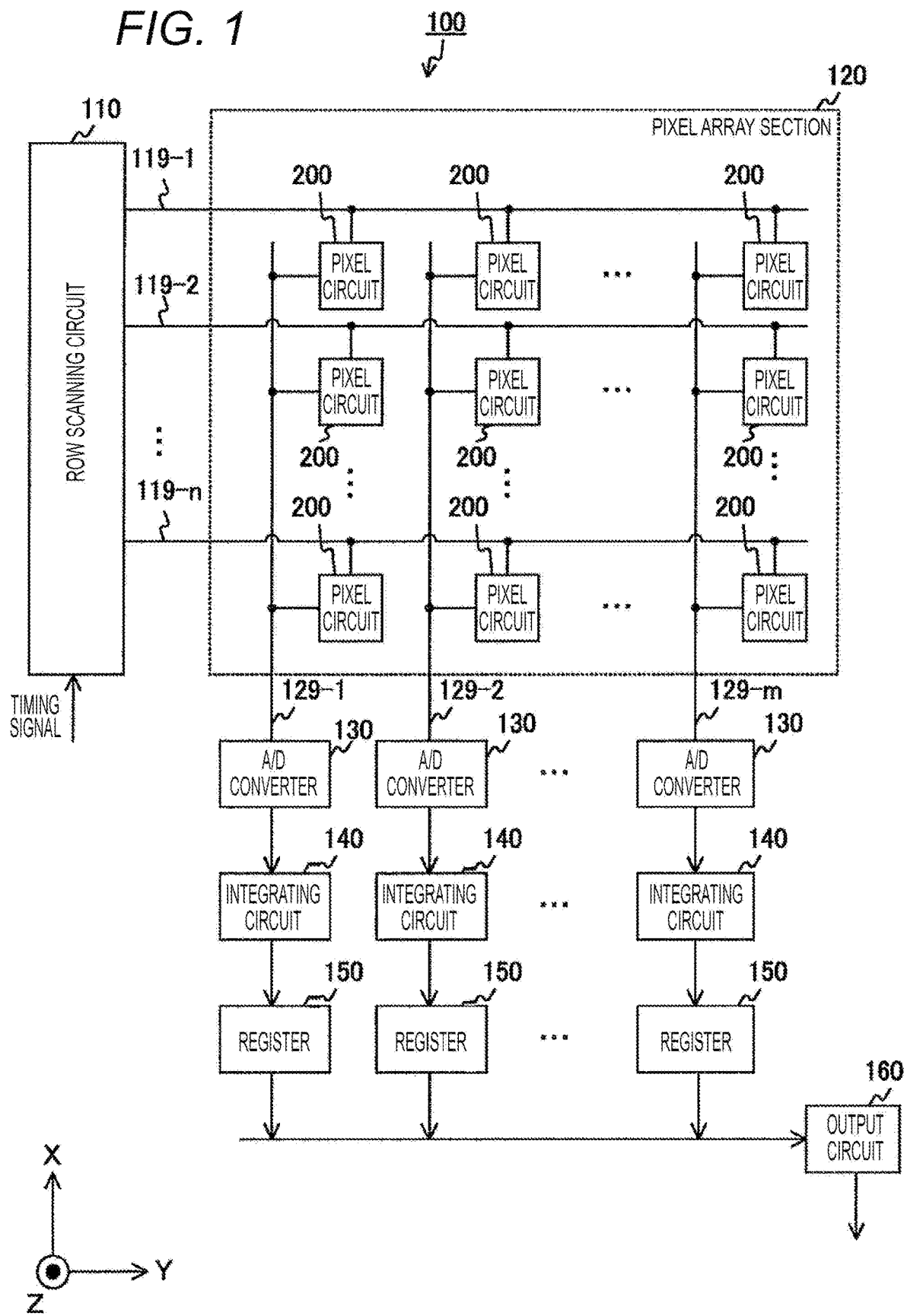
FIG. 1 is a block diagram illustrating one example configuration of an imaging device according to a first embodiment of the present technology.

FIG. 1 is a block diagram illustrating one example configuration of an imaging device 100 in an embodiment. The imaging device 100 is used to capture an image in an imaging apparatus or the like. The imaging device 100 includes a row scanning circuit 110, a pixel array section 120, multiple A/D converters 130, multiple integrating circuits 140, multiple registers 150, and an output circuit 160.

The pixel array section 120 includes multiple pixel circuits 200 arranged in the form of a two-dimensional lattice. In the pixel array section 120, rows of the pixel circuits 200, which are arranged in a predetermined direction (e.g., in a horizontal direction), are hereinafter referred to as "pixel rows", and columns of the pixel circuits 200, which are arranged vertically to the pixel rows, are hereinafter referred to as "pixel columns". The number of the pixel circuits 200 in each pixel row is represented by "m" (where m represents an integer), and the number of the pixel circuits 200 in each pixel column is represented by "n" (n represents an integer).

An axis along a direction (horizontal direction) in which the pixel rows are arranged is hereinafter referred to as a "Y axis", while an axis along a direction (vertical direction) in which the pixel columns are arranged is hereinafter referred to as an "X axis". An axis that is perpendicular to the X axis and the Y axis is hereinafter referred to as a "Z axis".

In the pixel array section 120, horizontal signal lines 119-1 to 119-$n$, and vertical signal lines 129-1 to 129-$m$ are arranged. One horizontal signal line 119-$i$ (where i represents an integer of 1 to n) is connected to pixel circuits 200 in the i-th pixel row, and to the row scanning circuit 110. In addition, one vertical signal line 129-$j$ (where j represents an integer of 1 to m) is connected to the pixel circuits 200 in the j-th column and to a corresponding one of the A/D converters 130.

Each pixel circuit 200 converts light incident therein into an analog electric signal under the control of the row scanning circuit 110. The pixel circuit 200 includes one photoelectric converter and multiple floating diffusion layers. It is assumed that the number of floating diffusion layers in the pixel circuit 200 is represented by "k" (where k represents an integer equal to 2 or greater). In other words, the number of the floating diffusion layers that correspond to one photoelectric converter is "k". These floating diffusion layers generate k signal voltages for one pixel circuit 200. The row scanning circuit 110 controls the pixel circuits 200 to sequentially output the signal voltages to the A/D converters 130 via the vertical signal line 129-$j$.

By sequentially selecting (or scanning) the pixel rows, the row scanning circuit 110 causes the pixel circuits 200 in the selected pixel row to output signal voltages. A timing signal is input to the row scanning circuit 110. The timing signal includes a horizontal synchronizing clock signal and an exposure timing signal. The horizontal synchronizing clock signal represents a timing at which one pixel row is selected (scanned). The exposure timing signal represents a timing of starting and ending the exposure period. These timing signals are generated when a predetermined operation (such as pressing a shutter button) for capturing an image is performed.

When the exposure period starts, the row scanning circuit 110 causes each pixel circuit 200 to release the charge of the floating diffusion layers in the pixel circuit 200 so as to reset the signal voltage thereof to an initial value. After the exposure period elapses, the row scanning circuit 110 sequentially generates row selection signals SEL_R1 to SEL_Rn in synchronization with the horizontal synchronizing clock signal. A row selection signal SEL_Ri is a signal for selecting the i-th pixel row. For example, by setting the row selection signal SEL_Ri to a low level, the row selection signal SEL_Ri is asserted, while by setting it to a high level, it is negated. A period in which the row selection signal SEL_Ri is asserted is set to the period (hereinafter referred to as the "horizontal synchronizing clock period") of the horizontal synchronizing clock signal. The row scanning circuit 110 supplies the generated row selection signal SEL_Ri to the i-th pixel row via a signal line 119-$i$. Note that the row scanning circuit 110 may assert the row selection signal SEL_Ri by setting it to the high level, and may negate the row selection signal SEL_Ri by setting it to the low level.

For each pixel circuit 200, the row scanning circuit 110 generates floating diffusion layer (FD) selection signals SEL_F1 SEL_Fk for sequentially selecting the k floating diffusion layers. The row scanning circuit 110 generates the FD selection signals SEL_F1 to SEL_Fk to the respective pixel circuits 200 in the i-th pixel row via the horizontal signal line 119-i. Details of control of the FD selection signals SEL_F1 to SEL_Fk are described later.

Each A/D converter 130 converts an analog electric signal into a digital signal. A/D conversion replaces a signal voltage with a digital signal representing the number of photons. Since signals voltages from the pixels are discretized, the imaging device 100 can easily count the number of photons with the A/D converters 130. The A/D converters 130 are provided in the respective pixel columns. The A/D converters 130 convert k electric signals sequentially output from the pixel columns into digital signals, and supply the digital signals to the integrating circuits 140. The k electric signals are sequentially output. Thus, even if the number of electric signals per pixel increases to k, the A/D converters 130 may only perform A/D conversion on the electric signals. Accordingly, it is not necessary for the A/D converters 130 to have a special circuit configuration.

The integrating circuits 140 add (integrate) the respective values of the k digital signals. The integrating circuits 140 are provided in the respective pixel columns. The integrating circuits 140 cause the registers 150 to hold, as pixel signals, signals representing the sums from the A/D converters 130. The sums each represent the number of photons per pixel. Note that each integrating circuit 140 is an example of an adder circuit in the appended claims.

The registers 150 hold the pixel signals. The registers 150 are provided in the respective pixel columns.

In synchronization with the horizontal synchronizing signal, the output circuit 160 sequentially reads and outputs each of the pixel signals in the pixel row. Since a pixel signal is generated for each of the pixel circuits 200, whose number is represented by "m*n", m*n pixel signals are output. An image made up of these pixel signals is recorded by a memory or the like in the imaging device.

Example Configuration of Pixel Circuit

Figure 2:
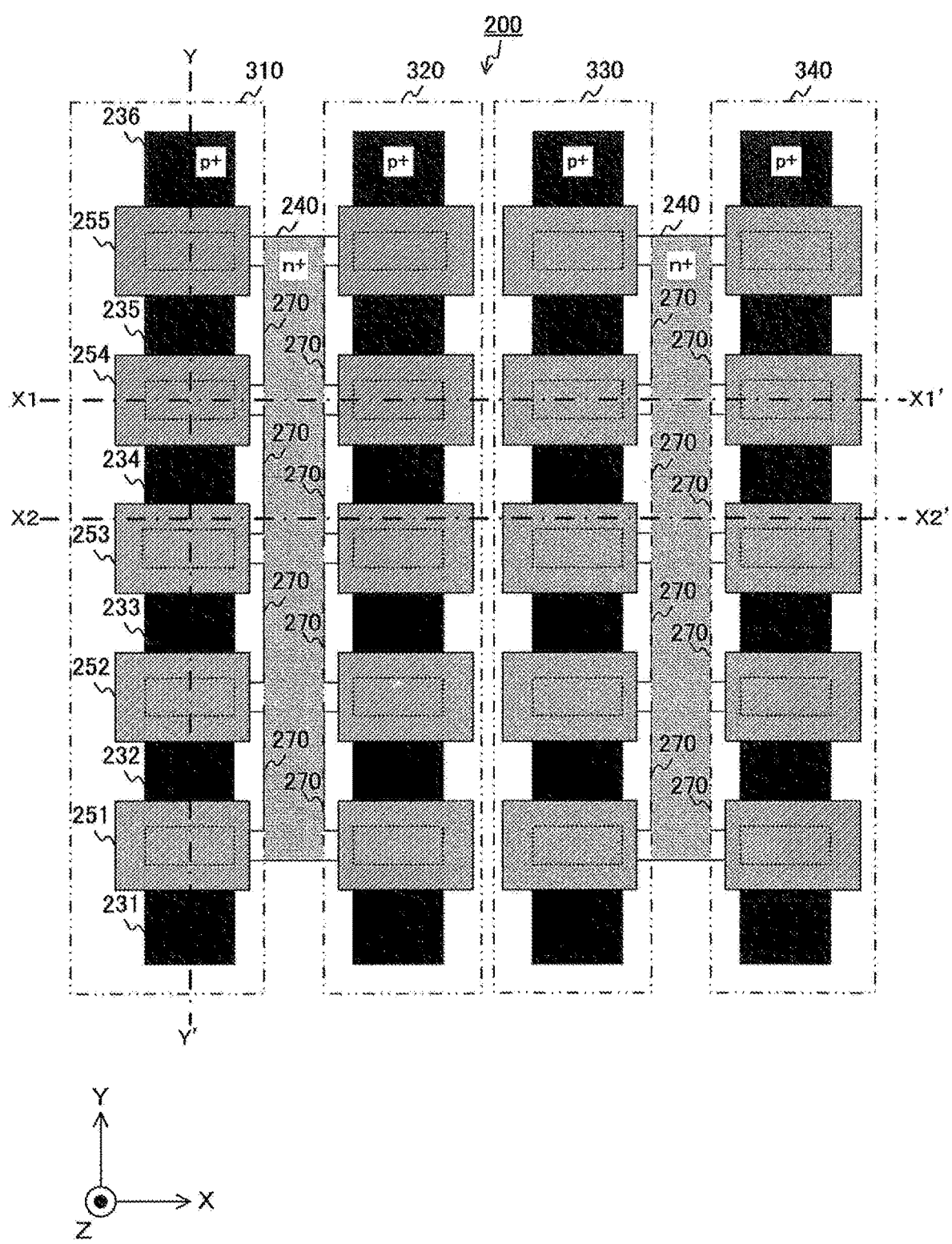
FIG. 2 is an example plan view illustrating a pixel circuit in the first embodiment.

FIG. 2 is an example plan view illustrating each pixel circuit 200 in the first embodiment. The pixel circuit 200 includes one photoelectric converter, floating diffusion (FD) columns 310, 320, 330, and 340, and a row selecting transistor. Note that in FIG. 2, the photoelectric converter and the row selecting transistor are not illustrated.

The FD column 310 includes multiple floating diffusion layers arranged in the Y axis direction (pixel column direction). In FIG. 2, each region surrounded by dotted lines represents a region in which a floating diffusion layer is formed. The FD columns 320, 330, and 340 are identical in configuration to the FD column 310. The FD columns 310, 320, 330, and 340 each include, for example, five floating diffusion layers. Since there are four FD columns each including five floating diffusion layers, the number of floating diffusion layers provided for one photoelectric converter is 20.

For example, a pixel that includes 20 floating diffusion layers capable of storing 250 charges can store 5000 charges. The amount of charge that can be stored increases. Thus, compared with a case where one floating diffusion layer is provided for one photoelectric converter, the imaging device 100, which includes multiple floating diffusion layers for one photoelectric converter, has an expanded dynamic range. Note that the number of floating diffusion layers provided for one photoelectric converter may be two or greater, and is not limited to 20.

Between the FD columns 310 and 320 is disposed an n+ layer 240 formed of an retype semiconductor having a relatively high impurity concentration, and the FD columns 310 and 320 are connected to the n+ layer 240. In addition, between the FD columns 330 and 340 is disposed an n+ layer 240, and the FD columns 330 and 340 are connected to the n+ layer 240. When the floating diffusion layer is reset, the charges stored in the floating diffusion layer are released to these n+ layers 240. Note that the n+ layer 240 is an example of a charge releasing layer in the appended claims.

Between each FD column and each n+ layer 240 is disposed a device isolation region 270 that is a linear groove formed in the Y axis direction avoiding a connection portion between the floating diffusion layer and the n+ layer 240. In this device isolation region 270, for example, a shallow trench isolation (STI) is formed.

Figure 3:
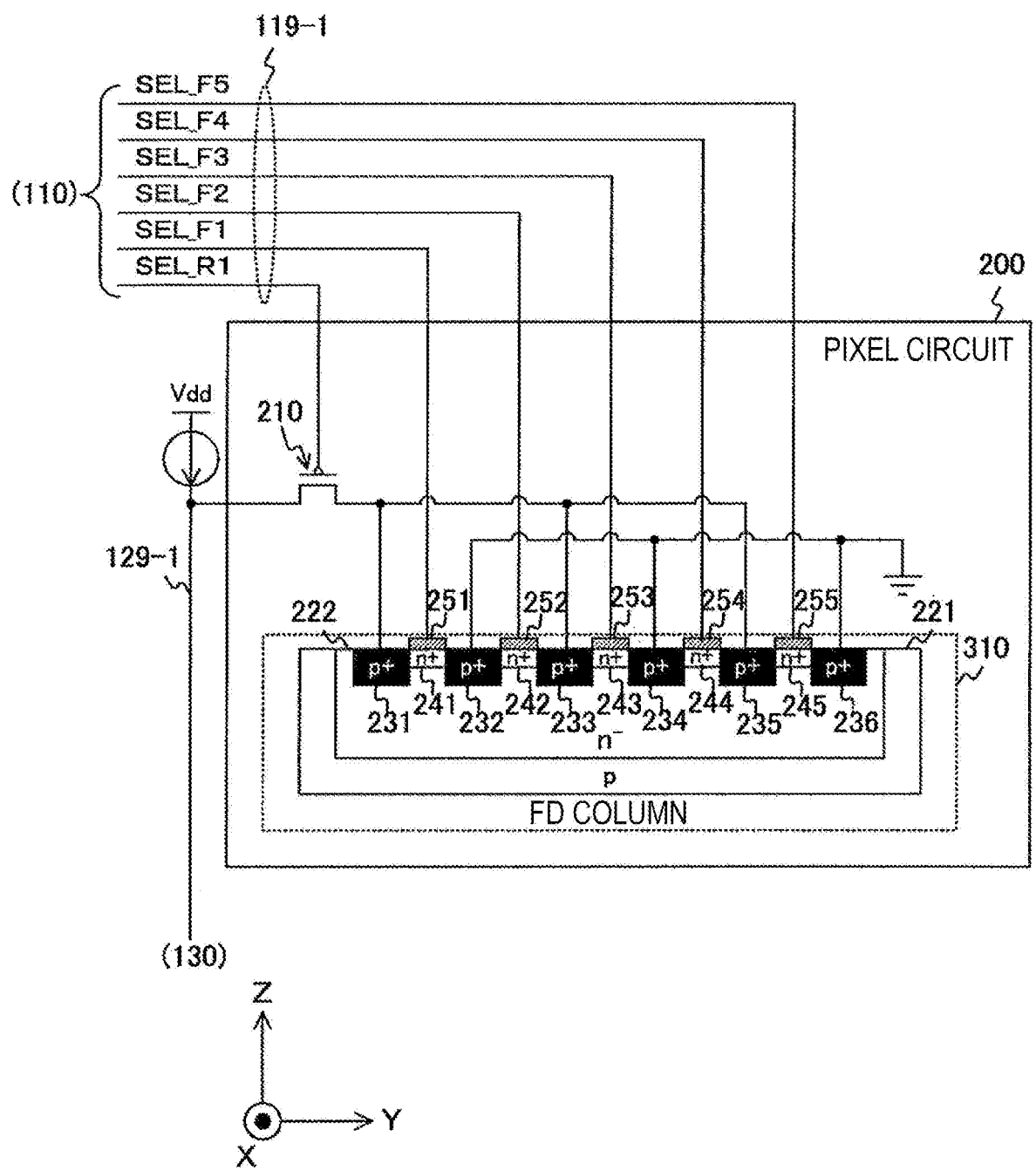
FIG. 3 is an example of a vertically sectional view illustrating the pixel circuit in the first embodiment.

FIG. 3 is an example sectional view along the vertical (Y axis) direction of the pixel circuit 200 in the first embodiment. Specifically, FIG. 3 illustrates a row selection transistor 210 in the pixel circuit 200, and a section of the FD column 310, taken along line Y-Y' in FIG. 2.

The row selection transistor 210 outputs the voltage generated by the pixel circuit 200 in the row to the A/D converter 130 in accordance with the row selection signal SEL_R1. For example, a p-type metal-oxide-semiconductor (MOS) transistor is used as the row selection transistor 210. The row selection signal SEL_R1 is input to the gate of the row selection transistor 210. The row selection transistor 210 has a source connected to the FD column 310 and a drain connected to the A/D converter 130. When the row selection signal SEL_Ri is in low level, the row selection transistor 210 enters an ON state to output the signal voltage generated by the FD column 310 to the A/D converter 130.

The FD columns 310, 320, 330, and 340 are formed on the photoelectric converter, which has two opposite planes. One plane of the photoelectric converter is used as a light receiving face for receiving light incident in the pixel circuit 200, while the other plane is used as an electrode face for disposing an electrode. Both planes are disposed so as to be perpendicular to the Z axis.

The photoelectric converter includes a p layer 221 formed of a p-type semiconductor and an n− layer 222 formed of a relatively low impurity concentration. The p layer 221 is disposed on the light receiving face of the photoelectric converter. For example, a p-well layer formed of a p-type semiconductor having a relatively high impurity concentration is used as the p layer 221.

On the electrode face of the p layer 221 is formed the n− layer 222 formed of an s-type semiconductor having a relatively low impurity concentration. A concentration of a p-type impurity in the p layer 221 is lower than concentration of a p-type impurity in any of the p+ layers 231 to 236.

When light is incident in the p layer 221, photovoltaic effect causes the p layer 221 and the n− layer 222 to generate electrons and positive holes having charge. In other words, the p layer 221 and the n− layer 222 function as a photodiode that converts light into charge.

On the electrode face of the n− layer 222 are formed multiple p+ layers 231 to 236 formed of p-type semiconductors having relatively a high impurity concentration, and multiple floating diffusion layers 241 to 246 (n+ layers) formed of n-type semi-conductors having a relatively high impurity concentration. A concentration of an n-type impurity in the n− layer 222 is lower than concentration of an n-type impurity in any of the n+ layers 241 to 246.

Assuming that the number of p+ layers is s+1 (where s represents an integer of 2 or greater), the number of floating diffusion layers is s in which 1 is less than the number of p+ layers. The p+ layers and the floating diffusion layers are alternately disposed along the Y axis direction. When s=5, p+ layers 231 to 236, and floating diffusion layers 241 to 245 are disposed. In this disposition, odd-numbered p+ layers 231, 233, and 235 are connected to the source of the row selection transistor 210. In addition, even-numbered p+ layers 232, 234, and 236 are connected to the point of a reference potential lower than a power-supply potential Vdd.

The floating diffusion layers 241 to 245 store the charges generated in the photodiodes (the p layer 221 and n− layer 222). The floating diffusion layers 241 to 245 each have a constant capacitance C, and generates a signal voltage V according to the amount Q of stored charge on the basis of the relationship of Q=CV. A gate insulation film 224 is formed on surfaces of the electrode faces of the floating diffusion layers 241 to 245. Gate electrodes 251 to 255 are formed on the gate insulation film 224. The FD selection signals SEL_F1 to SEL_F5 are input to the gate terminals, respectively.

The p+ layers 231 and 232, and the n− layer 222, which are adjacent to the floating diffusion layer 241, function as a p-type MOS transistor in which the n− layer 222 serves as a substrate, the p+ layer 231 serves as a source/drain 231, and the p+ layer 232 serves as a source/drain 232. In other words, the floating diffusion layer 241 is formed in the substrate below the gate of the p-type MOS transistor, with its electrode face upturned. In other words, the floating diffusion layer 241 is formed between the source/drain 232 and the source/drain 231.

Similarly, the p+ layers adjacent to the floating diffusion layers 242, 243, 244, and 245, and the n− layer 222 function as p-type MOS transistors, respectively. A signal voltage generated by the floating diffusion layers 241 to 245 are applied to the back gates of the p-type MOS transistors. Note that the floating diffusion layers 241 to 245 are an example of a charge storage unit in the appended claims.

With this configuration, in the FD column 310 are formed five p-type MOS transistors that have source/drains connected in parallel between the point of the power-supply potential Vdd and the point of the reference potential. When FD selection signals in low level are input to the gates of these p-type MOS transistors, the p-type MOS transistors release the charges stored in the floating diffusion layers to the n+ layers 240 illustrated in FIG. 2. This resets the amount of charges in the floating diffusion layers to an initial value.

When FD selection signals in a middle level higher than the low level are input to the p-type MOS transistors, the p-type MOS transistors enter an ON state (conduction state). When FD selection signals are in middle level, the threshold value of the voltage between the gate of each p-type MOS transistor and a source/drain of each p-type MOS transistor changes in accordance with a signal voltage applied to the back gate of the p-type MOS transistor.

Floating diffusion layer 241 is a hack gate of the p-type MOS transistor 321. Floating diffusion layer 242 is a back gate of the p-type MOS transistor 322. Floating diffusion layer 243 is a back gate of the p-type MOS transistor 323. Floating diffusion layer 244 is a back gate of the p-type MOS transistor 324. Floating diffusion layer 245 is a back gate of the p-type MOS transistor 325.

As described above, effect in which the threshold value of the MOS transistor changes in accordance with the voltage applied to the back gate is called "back gate effect" or "substrate bias effect".

The p-type MOS transistors output a voltage according to a change amount in threshold value, that is, an amplified signal voltage, to the row selection transistor 210. A transistor in which, as described above, floating diffusion layers are disposed between the source/drains, and a threshold value changes according to a signal voltage generated in the floating diffusion layers is called a "threshold-modulated transistor".

In this threshold modulated transistor, the capacitance C of floating diffusion layers can significantly be decreased, compared with a common complementary MOS (CMOS), because the floating diffusion layers are configured by only capacitors in a substrate below gates. Thus, conversion efficiency can be increased. Although a decrease in capacitance C decreases a dynamic range, by accordingly increasing the number of floating diffusion layers, the necessary dynamic range can be ensured.

In addition, an FD selection signal in high level higher than the middle level is input to a p-type MOS transistor, the p-type MOS transistor enters an OFF state (non-conduction) to only store charge. The above-described transistor that is driven by three values: the low level; the middle level; and the high level is called the "three-value driven transistor".

Note that although a configuration in which a p-type MOS transistor is used as a transistor for amplifying a signal voltage is employed, the pixel circuit 200 is not limited to this configuration. For example, instead of the p-type MOS transistor, an re-type MOS transistor may be used as a transistor for amplifying a signal voltage. In addition, although the threshold-modulated transistor is used as a transistor for amplifying a signal voltage, the pixel circuit 200 is not limited to this configuration. For example, a transistor other than the threshold modulated transistor may be used as the transistor for amplifying the signal voltage. In this case, the signal voltage is applied to the gate of the amplifying transistor.

Figure 4A:
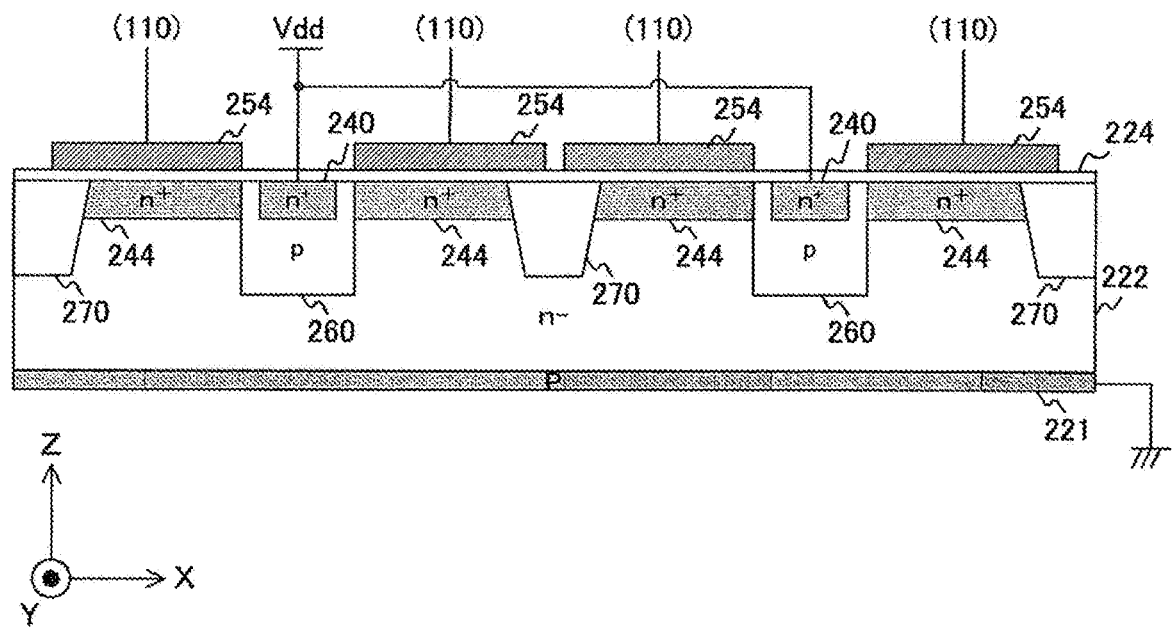
FIGS. 4A and 4B are examples of horizontally sectional views illustrating the pixel circuit in the first embodiment.
Figure 4B:
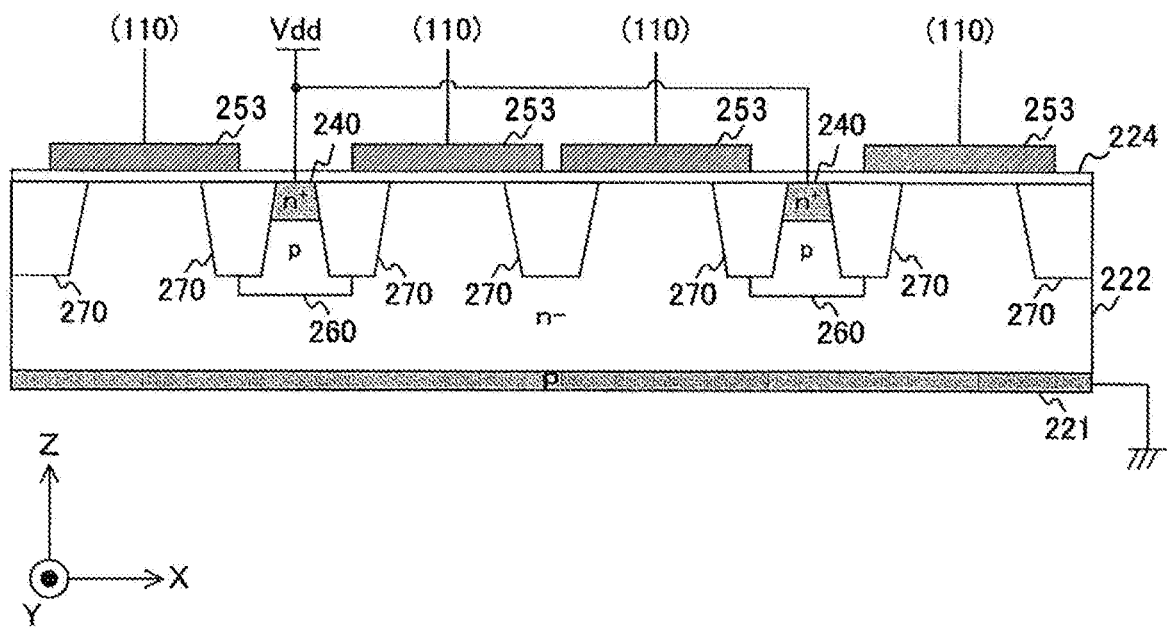

FIGS. 4A and 4B are examples of horizontally (X axial) sectional views illustrating the pixel circuit 200 in the first embodiment. FIG. 4A is an example sectional view, taken along line X1-X1' in FIG. 2, illustrating the pixel circuit 200.

On the electrode face of the n− layer 222 are formed floating diffusion layers 244 corresponding to the FD columns 310, 320, 330, and 340. On the electrode faces of the floating diffusion layers 244 is formed gate insulation film 224. On the gate insulation film 224 are formed gate electrodes 254. A gate insulation film 224 is between the electrode face of the n− layer 222 and the gate electrodes 254.

In addition, a p layer 260 formed of a p-type semiconductor is formed between the floating diffusion layer 244 in the first FD column 310 and the floating diffusion layer 244 in the second FD column 320. On the electrode face of the p layer 260 is formed an n+ layer 240 having a relatively high n-type semiconductor. The power-supply potential Vdd is applied to the n+ layer 240. A p layer 260 is formed between the floating diffusion layer 244 in the third FD column 330 and the floating diffusion layer 244 in the fourth FD column 320. On the electrode face of the p layer 260 is formed an n+ layer 240.

In addition, a device isolation region 270 is formed between the floating diffusion layer 244 in the second FD column 320 and the floating diffusion layer 244 in the third FD column 330. Device isolation regions 270 are formed at opposite ends of the pixel circuit 200 in the X axis direction.

FIG. 4B is an example sectional view, taken along line X2-X2' in FIG. 2, illustrating the pixel circuit 200. On the electrode face of the n- layer 222 are formed gate isolation films 254 corresponding to the FD columns 310, 320, 330, and 340.

A p layer 260 and an n+ layer 240 are formed between the gate isolation film 254 in the FD column 310 and the gate isolation film 254 in the FD column 320. Device isolation regions 270 are formed between a set of the p layer 260 and the n+ layer 240, and adjacent gate isolation films 254. In addition, a set of a p layer 260 and an n+ layer 240 is formed between a gate isolation film 254 in the FD column 330 and a gate isolation film 254 in the FD column 340, and device isolation regions 270 are formed between this set and adjacent device isolation regions 270. Further, device isolation regions 270 are formed at opposite ends of the pixel circuit 200 in the X axis direction.

Figure 5:
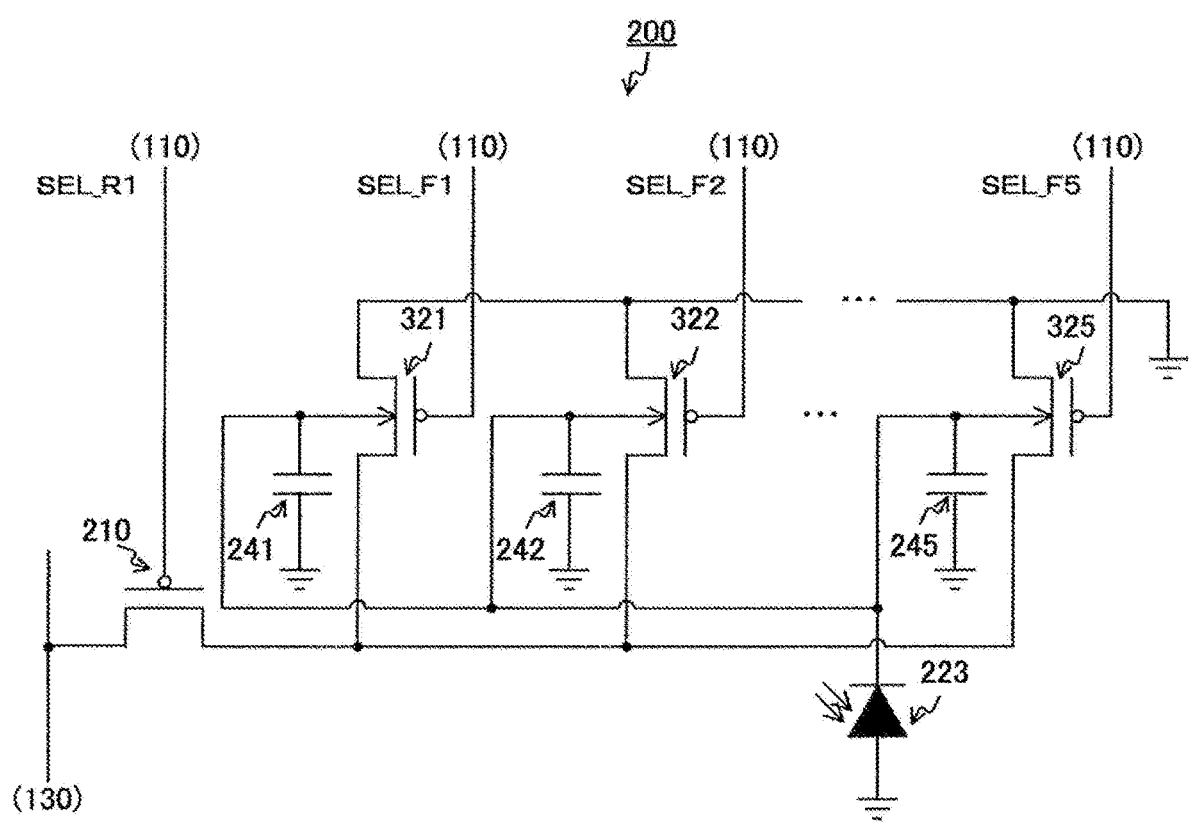
FIG. 5 is an example of an equivalent circuit diagram illustrating the pixel circuit in the first embodiment.

FIG. 5 is an example of an equivalent circuit diagram illustrating the pixel circuit 200 in the first embodiment. This pixel circuit 200 includes a row selection transistor 210, a photoelectric converter 223, floating diffusion layers 241 to 245, and amplifying transistors 321 to 325. FIG. 5 is an equivalent circuit diagram illustrating the row selection transistor 210, and the floating diffusion layer and the amplifying transistor in any of the four FD columns. In FIG. 5, the floating diffusion layers and the amplifying transistors in the other three FD columns are not illustrated.

The row selection transistor 210 has a drain connected to the A/D converter 130 and a source connected to the amplifying transistors 321 to 325. A row selection signal SEL_R1 is input to the gate of the row selection transistor 210.

The photoelectric converter 223 converts light incident therein into charge and supplies the charge to floating diffusion layers 241 to 245. The photoelectric converter 223 includes the p layer 221 and the n- layer 222 illustrated in FIG. 3. The p layer 221 forms an anode of the photoelectric converter 223 while the n- layer 222 forms the cathode of the photoelectric converter 223.

The floating diffusion layers 241 to 245 respectively store charge to generate signal voltages according to the stored amounts of charge, and apply the signal voltages to the amplifying transistors 321 to 325.

The reference potential is applied to the source/drains 232, 234, 236 of the amplifying transistors 321 to 325 are connected to the row selection transistor 210. The FD selection signals SEL_F1 to SEL_F5 are input to the gates of the amplifying transistors 321 to 325, respectively. The amplifying transistor 321 includes the p+ layers 231 and 232 and n- layer 222 illustrated in FIG. 3. Each of the amplifying transistors 322 to 325 includes two p+ layers adjacent to each of the floating diffusion layers 242 to 245, and the n- layer 222. Note that the circuit including the row selection transistor 210 and the amplifying transistors 321 to 325 is an example of an amplifier in the appended claims.

Note that the configuration of the pixel circuit 200 may differ from that illustrated in FIG. 2 or 3 if that realizes the circuit represented by the equivalent circuit diagram illustrated in FIG. 5.

Figures 6, 7:
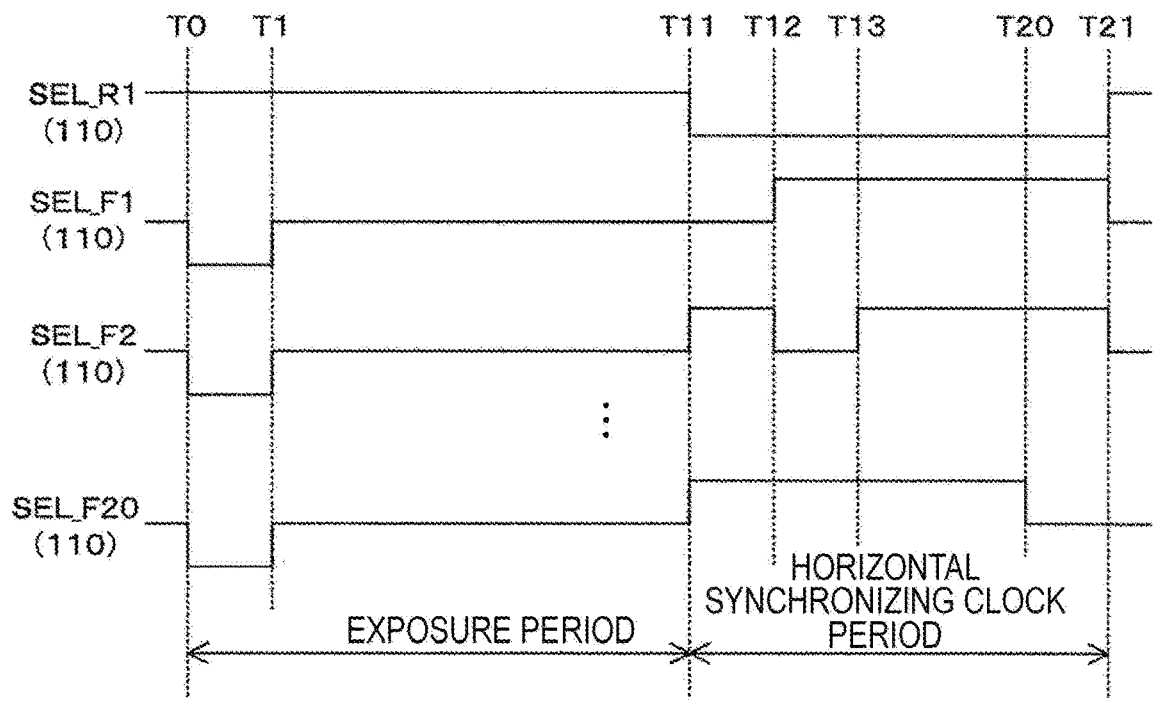
FIG. 6 is a chart illustrating one example of operation of an amplifying transistor in the first embodiment.
FIG. 7 is a timing chart illustrating one example of control of the pixel circuit in the first embodiment.

FIG. 6 is a chart illustrating one example of operation of the amplifying transistor 321 in the first embodiment. Operations of the amplifying transistors 322 to 325 are similar to the operation of the amplifying transistor 321.

When the FD selection signal SEL_F1 is in high level, the amplifying transistor 321 enters an OFF state to cause the floating diffusion layer 241 to store charge. In this case, no signal voltage is output by the amplifying transistor 321. When the FD selection signal SEL_F1 is in middle level, the amplifying transistor 321 enters an ON state, and amplifies and outputs a signal voltage according to the amount of charge stored in the floating diffusion layer 241. When the FD selection signal SEL_F1 is in low level, the amplifying transistor 321 is reset by causing the floating diffusion layer 241 to release charge.

Example Operation of Imaging Device

FIG. 7 is a timing chart illustrating one example of control of the pixel circuit 200 in the first embodiment. In duration from timings T0 at which an exposure period starts to T1, the row scanning circuit 110 sets all FD selection signals SEL_F1. to SEL_F20 to the low level. This depletes each of the 20 floating diffusion layers. In duration from timings T1 to T11 at which exposure ends, the row scanning circuit 110 sets all the FD selection signals SEL_F1 to SEL_F20 to the middle level. In addition, in an exposure period, a row selection signal SEL_R1 is set (negated) to the high level. This causes the 20 floating diffusion layers to store amounts of charge according to the amount of exposure.

At the time the exposure period ends, by controlling the row selection signal SEL_R1 and the FD selection signals SEL_F1 to SEL_F20, the row scanning circuit 110 causes the signal voltages generated by the 20 respective floating diffusion layers to be sequentially output. Specifically, the row scanning circuit 110 sets (asserts) the row selection signal SEL_R1 to the low level in the horizontal synchronizing clock period. While the row selection signal SEL_R1 is being asserted, the row scanning circuit 110 sequentially selects the 20 floating diffusion layers as output objects, sets only FD selection signals corresponding to the output objects to the middle level, and sets the other FD selection signals to the high level. This causes amplifying transistors corresponding to the floating diffusion layers as the output objects to be in ON state, whereby only signal voltages as the output objects are output.

For example, in duration from timing T11 at which the exposure ends to timing T12, the row scanning circuit 110 sets only the FD selection signal SEL_F1 to the middle level, and sets the other FD selection signals SEL_F2 to SEL_F20 to the high level. In addition, in duration from timings T12 to T13, the row scanning circuit 110 sets only the FD selection signal SEL_F2 to the middle level. After that, similarly, the FD selection signals SEL_F3 to SEL_F20 are sequentially set to the middle level. In order to sequentially read the respective signal voltages in multiple floating diffusion layers, as described above, signal voltages to be read can significantly be lowered, compared with the configuration in which one floating diffusion layer realizes the same dynamic range.

In FIG. 7, exposure and reading in the second and more FD columns are not illustrated. The timing of starting the exposure and reading in the second and more FD columns is delayed for the horizontal synchronizing clock period with respect to the previous FD column. This type of reading method is called the "rolling shutter method". Note that by using a mechanical shutter in combination, exposure timings for all the pixels can be set to be simultaneous.

Although in the imaging device 100, pixel signals are read once from one pixel circuit 200, the pixel signals may time-divisionally be read from one pixel circuit 200 a multiple number of times. Each integrating circuit 140 adds up the pixel signals, whereby the dynamic range is more expanded.

Figure 8:
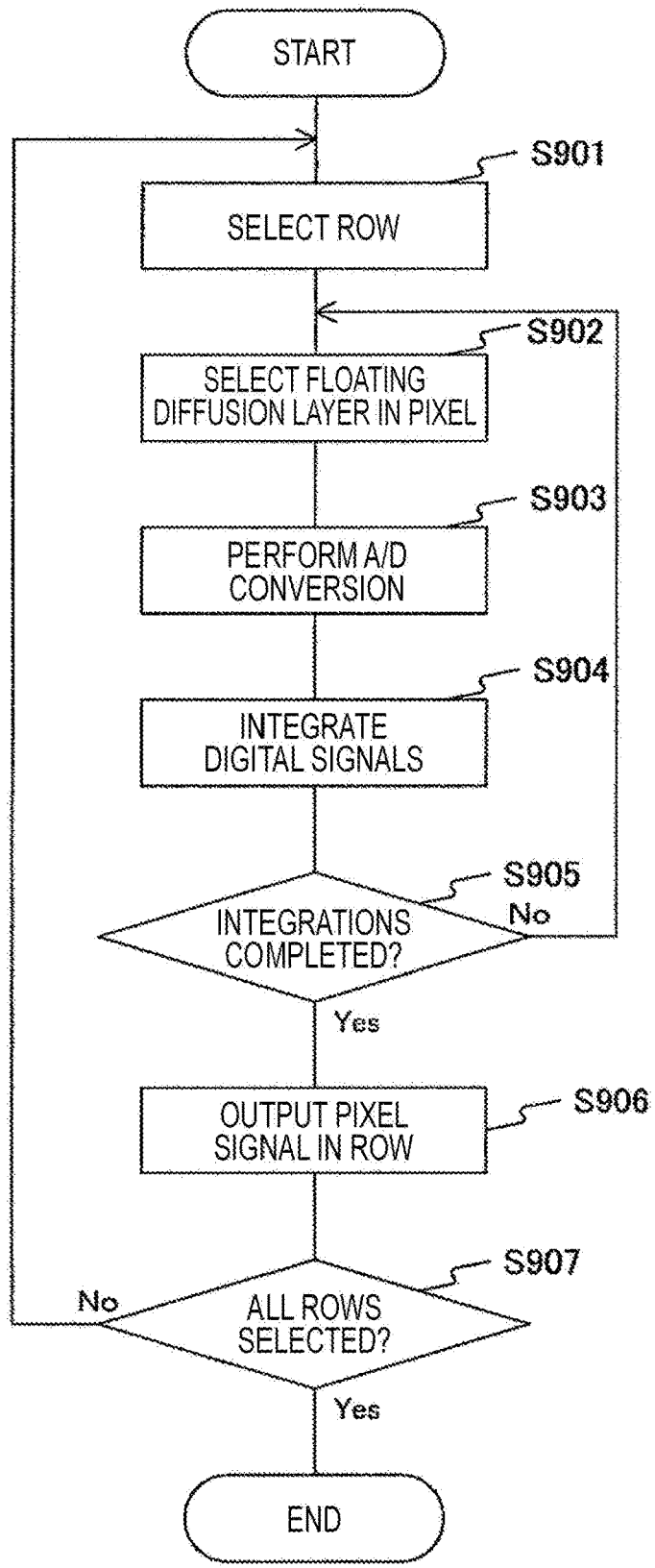
FIG. 8 is a flowchart illustrating one example of operation of an imaging device in the first embodiment.

FIG. 8 is a flowchart illustrating one example of operation of the imaging device 100 in the first embodiment. This operation starts, for example, when the exposure period ends. In step S901, the imaging device 100 selects a pixel column by setting only any of the row selection signals SEL_R1 to SEL_Rn to the high level.

In step S902, the imaging device 100 selectively causes any of the floating diffusion layers in the pixel to output signal voltages by controlling the FD selection signals SEL_F1 to SEL_F20. In step S903, the imaging device 100 performs A/D conversion on the output signal voltages. In step S904, the imaging device 100 integrates digital signals. In step S905, the imaging device 100 determines whether or not k (e.g., 20) integrations have been completed, where k represents the number of floating diffusion layers in one pixel circuit 200. If the integrations have not been completed ("NO" in step S905), the imaging device 100 returns to step S902.

If the integrations have been completed ("YES" in step S905), in step S906, the imaging device 100 outputs, as a pixel signal, an integration value in each pixel in the row. In step S907, the imaging device 100 determines whether or not all the rows have been selected. If all the rows have not been selected ("NO" in step S907), the imaging device 100 returns to step S901. On the other hand, if all the rows have been selected ("YES" in step S907), the imaging device 100 terminates an operation of outputting the pixel signal.

As described above, according to the first embodiment of the present technology, in the imaging device 100, by providing each photoelectric converter with multiple charge storage units, pixel signals are generated from signal voltages generated by the charge storage units. Thus, the dynamic range can be expanded.

2. Second Embodiment

Example Configuration of Imaging Device

Although in the first embodiment, the amplifying transistors 321 to 325 are connected in parallel, they may be connected in series. An imaging device 100 according to a second embodiment of the present technology differs from that in the first embodiment in that the amplifying transistors 321 to 325 are connected in series.

Figure 9:
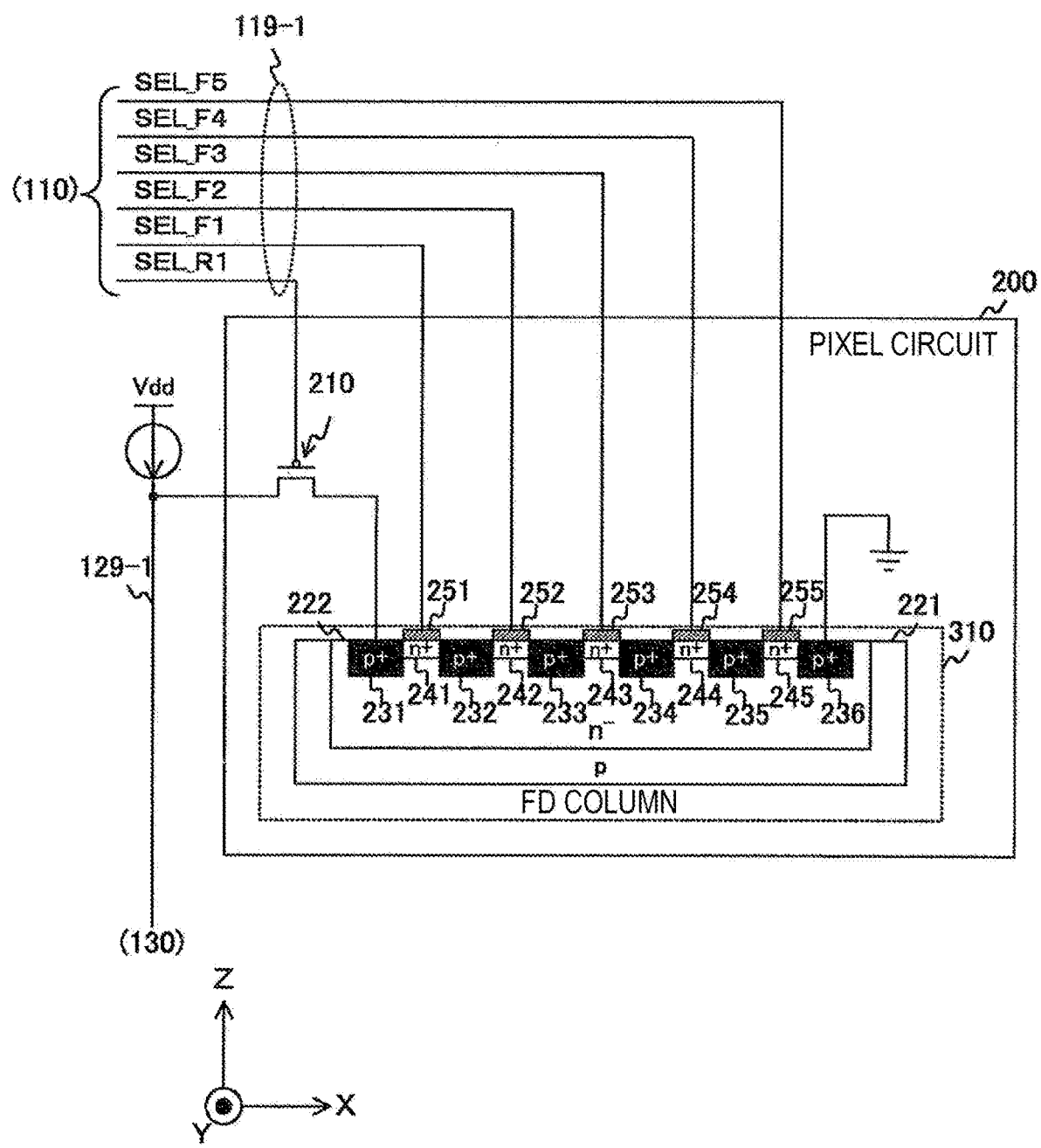
FIG. 9 is an example of a vertically sectional view illustrating a pixel circuit in a second embodiment of the present technology.

FIG. 9 is an example of a vertically sectional view illustrating a pixel circuit 200 in the second embodiment. The pixel circuit 200 differs from that in the first embodiment in that the reference potential is not applied to the p+ layers 232, 233, 234, and 235.

Figure 10:
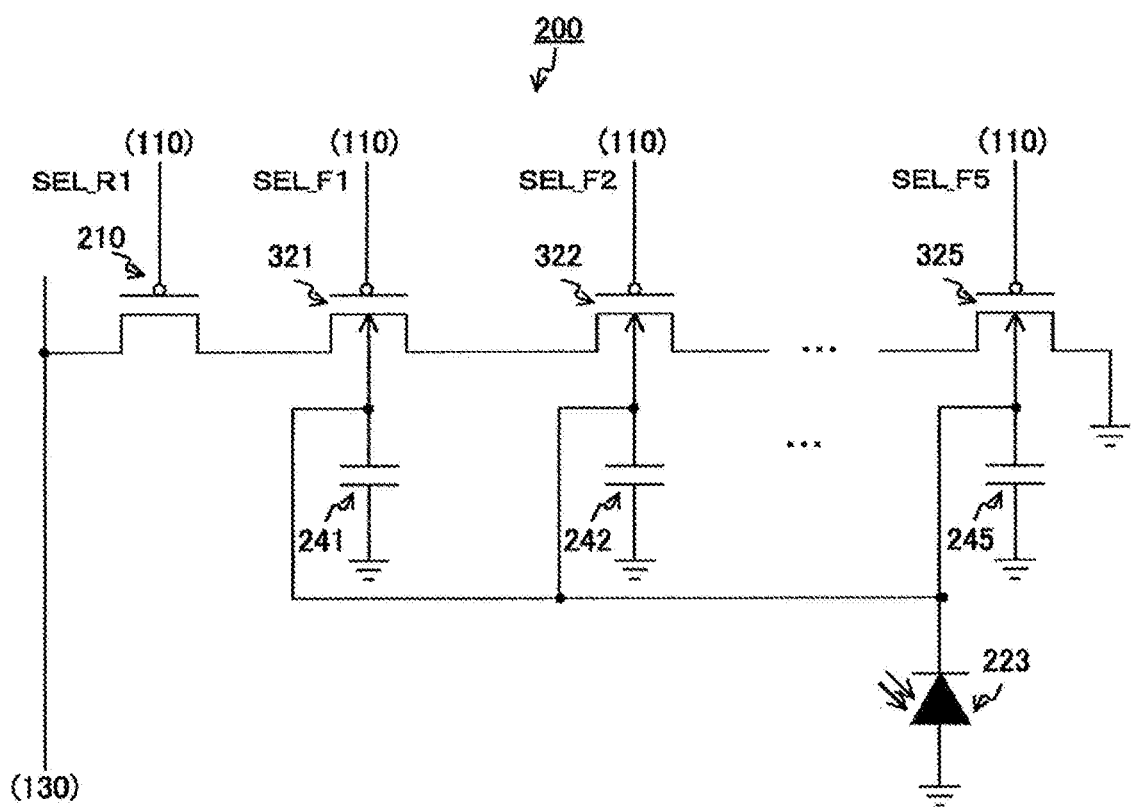
FIG. 10 is an example of an equivalent circuit diagram illustrating the pixel circuit in the second embodiment.

In this configuration, the source/drains 231 to 236 of the amplifying transistors 321 to 325 are connected in series. The amplifying transistors 321 to 325 include an p-layer 222 and p+ layers 231 to 236. As illustrated in FIG. 10, it is not necessary to apply the reference potential to the p+ layers 232, 233, 234, and 235. Thus, compared with the first embodiment in which the amplifying transistors 321 to 325 are connected in parallel, the wiring pitch of the floating diffusion layers 241 to 245 can be decreased. This facilitates fine wiring.

FIG. 10 is an example equivalent circuit diagram of the pixel circuit 200 in the second embodiment. The equivalent circuit in the second embodiment differs from that in the first embodiment in that the source/drains 231 to 236 of the amplifying transistors 321 to 325 are connected in series.

Figures 11, 12:
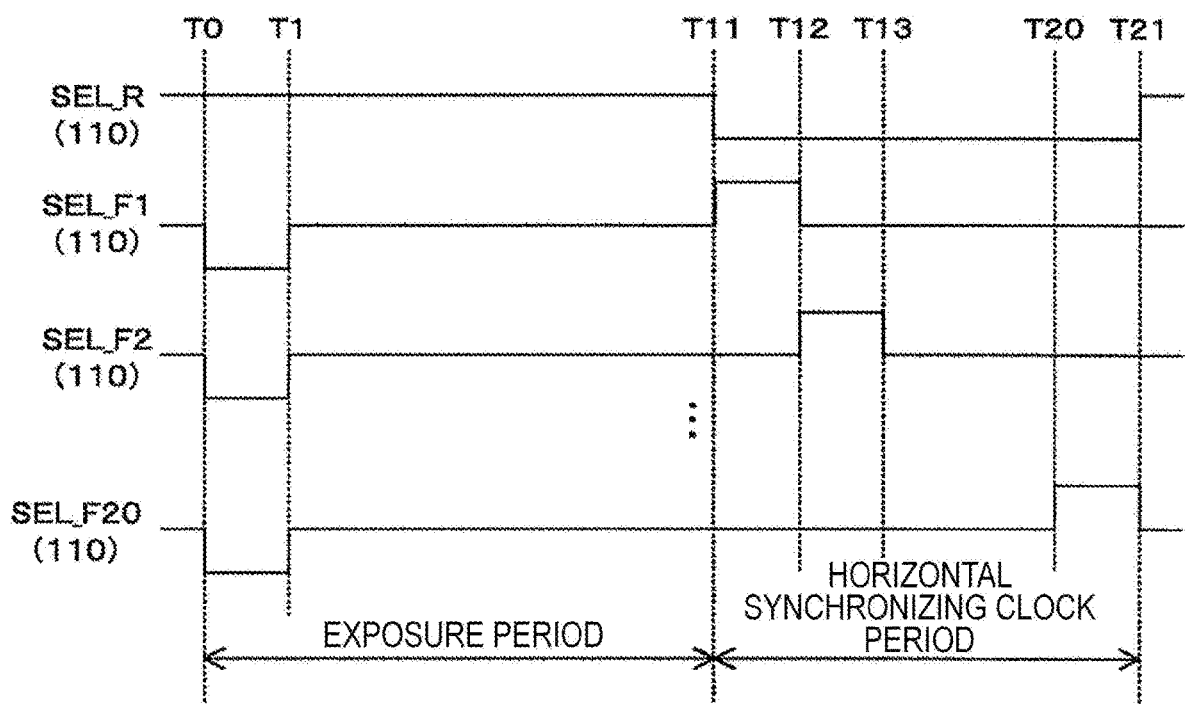
FIG. 11 is a chart illustrating one example of operation of an amplifying transistor in the second embodiment.
FIG. 12 is a timing chart illustrating one example of control of the pixel circuit in the second embodiment.

FIG. 11 is a chart illustrating one example of operation of the amplifying transistor 321 in the second embodiment. The operation of the amplifying transistor 321 in the second embodiment when the FD selection signal SEL_F1. is in middle level or high level differs from that in the first embodiment. Specifically, when the amplifying transistor 321 is in high level and middle level, in each case the amplifying transistor 321 enters an ON state. However, the threshold value of one amplifying transistor when the FD selection signal SEL_F1 is in high level is higher than that of the amplifying transistor when the FD selection signal SEL_F1 is in middle level, resulting in amplifying and outputting a signal voltage according to the amount of charge stored in one floating diffusion layer 241 corresponding to the amplifying transistor when the FD selection signal SEL_F1 is in high level. The operations of the amplifying transistors 322 to 325 are identical to those of the amplifying transistor 321.

Example of Operation of Imaging Device

FIG. 12 is a timing chart illustrating one example of control of the pixel circuit 200 in the second embodiment.

In duration from timing T0 at which an exposure period starts to timing T1, the row scanning circuit 110 sets all the FD selection signals SEL_F1 to SEL_F20 to the low level. This depletes all the 20 floating diffusion layers.

In duration from timings T1 to T11, the row scanning circuit 110 sets all the FD selection signals SEL_F1 to SEL_F20 to the middle level. Within the exposure period, a row selection signal SEL_R1 is set (negated) to the high level.

In addition, termination of the exposure period causes the row scanning circuit 110 to set (assert) the SEL_R1 to the low level in the horizontal synchronizing clock period. While the SEL_R1 is being asserted, the row scanning circuit 110 selects the 20 floating diffusion layers as output objects to set only FD selection signals corresponding to the output objects to the high level, and sets the other FD selection signals to the middle level. In this manner, the threshold value of one amplifying transistor when the FD selection signal is in high level becomes higher than the threshold value of the amplifying transistor when the FD selection signal is in middle level, resulting in outputting only a signal voltage as an output object.

As described above, according to the second embodiment, since the respective amplifying transistors are connected in series, the number of wires can be reduced. This easily forms a fine configuration of the imaging device 100.

3. Third Embodiment

Example Configuration of Imaging Device

Although in the first embodiment, the three-value driven amplifying transistors 321 to 325 perform resetting together with amplifying the signal voltage, they may not completely deplete the floating diffusion layers. The imaging device 100 in the third embodiment differs from that in the first embodiment in that it further includes a reset transistor for completely depleting the floating diffusion layers.

Figure 13:
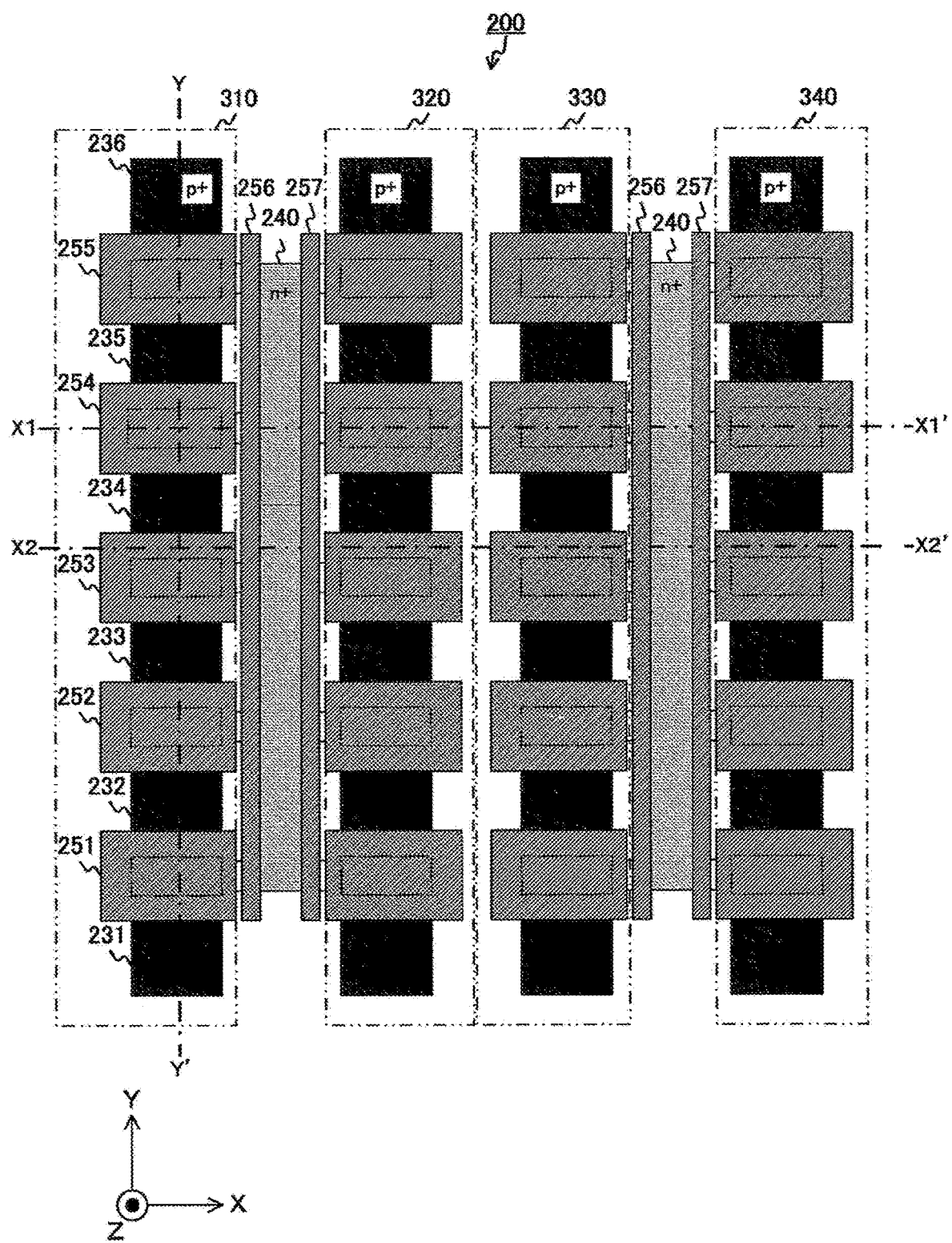
FIG. 13 is an example plan view illustrating a pixel circuit in a third embodiment.

FIG. 13 is an example plan view illustrating a pixel circuit 200 in a third embodiment of the present technology. The pixel circuit 200 in the third embodiment differs from that in the first embodiment in that reset gate electrodes 256 and 257 are further formed via an electrode on the electrode face of a p layer 260 and a device isolation region 270 around each n+ layer 240.

Figure 14A:
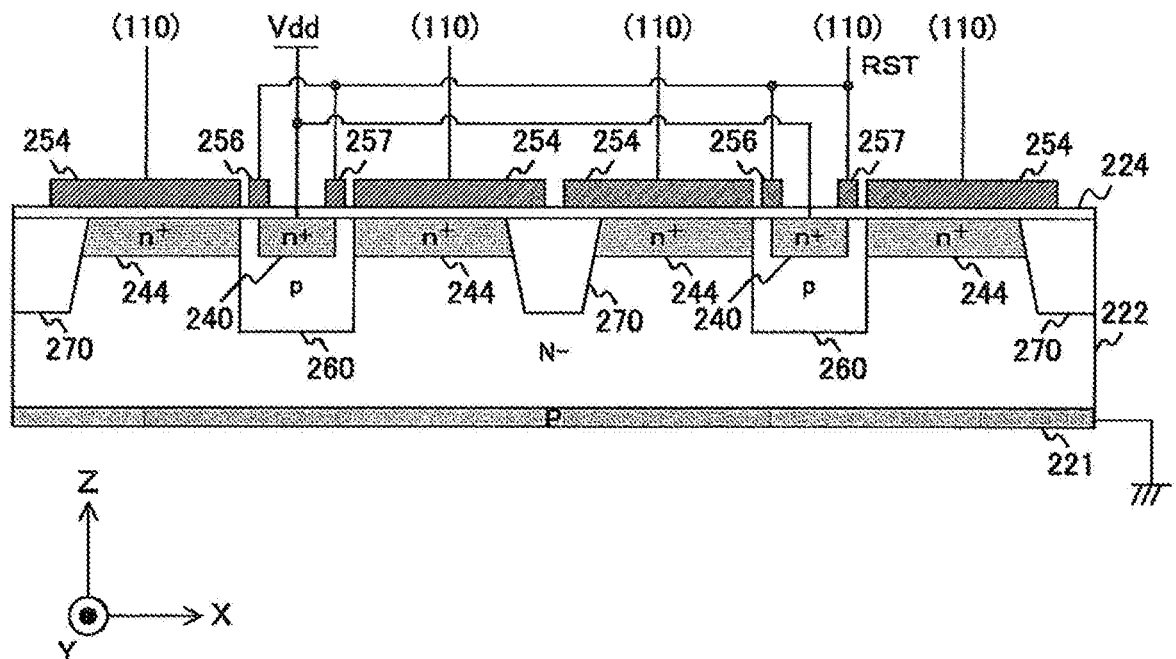
FIGS. 14A and 14B are examples of horizontally sectional views illustrating the pixel circuit in the third embodiment.
Figure 14B:
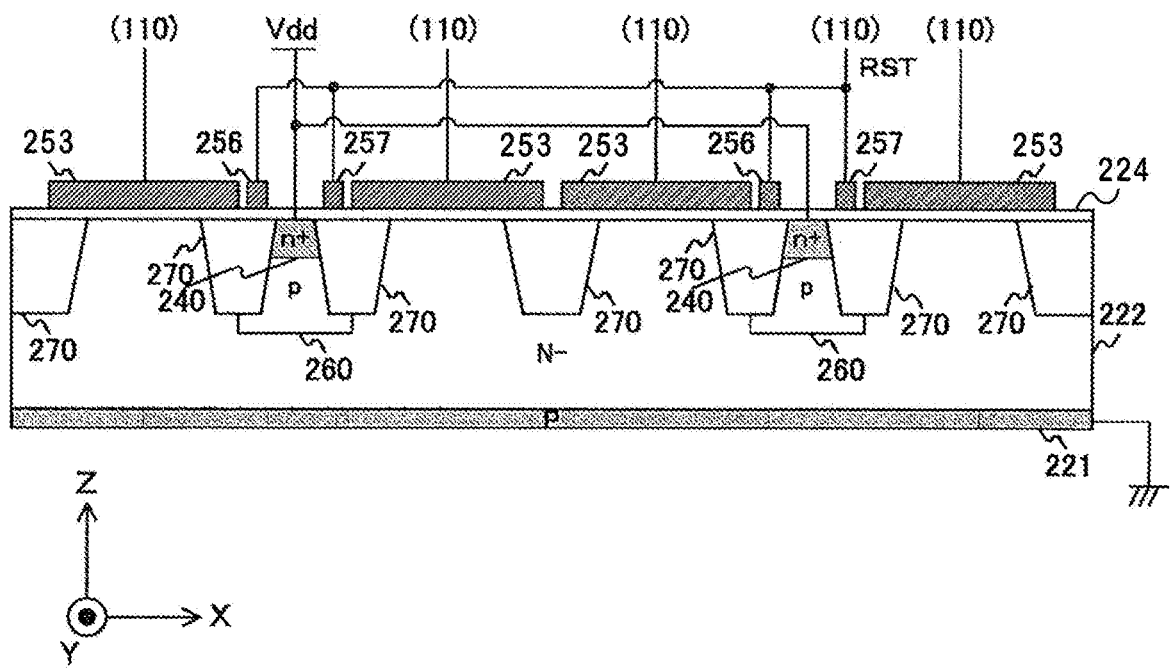

FIGS. 14A and 14B are examples of horizontally (X axial) sectional views illustrating the pixel circuit 200 in the third embodiment. FIG. 14A is an example sectional view illustrating the pixel circuit 200, taken along line X1-X1' in FIG. 13. As illustrated in FIG. 14A, on the electrode face of the p layer 260 are formed the reset gate electrodes 256 and 257. A reset signal RST is input to these reset terminals. This reset signal RST is a signal that controls initialization of the amount of stored charge, that is, timing for resetting. For example, the reset signal RST is set to the high level in a resetting period, and is set to the low level in a non-resetting period.

The p layer 260 including the reset gate electrodes 256 and 257, and the n+ layer 240 and the floating diffusion layer 244 adjacent to the p layer 260 operate as an n-type MOS transistor 326 including the p layer 260 as a channel region of the n-type MOS transistor 326, and the n+ layer 240 and the floating diffusion layer 244 respectively as a source 244 of the n-type MOS transistor 326 and a drain 240 of the n-type MOS transistor 326. When the reset signal RST is in high level, this n-type MOS transistor enters an ON state to cause the charge stored in the floating diffusion layers 241 to 245 to be released to the n+ layer 240. On the other hand, when the rest signal RST is in low level, the n-type MOS transistor enters an OFF state.

FIG. 14B is an example sectional view, taken along line X2-X2' in FIG. 13, illustrating the pixel circuit 200. As illustrated in FIG. 14B, the reset gate electrodes 256 and 257 are formed above the electrode face of the device isolation region 270 via an electrode.

Figure 15:
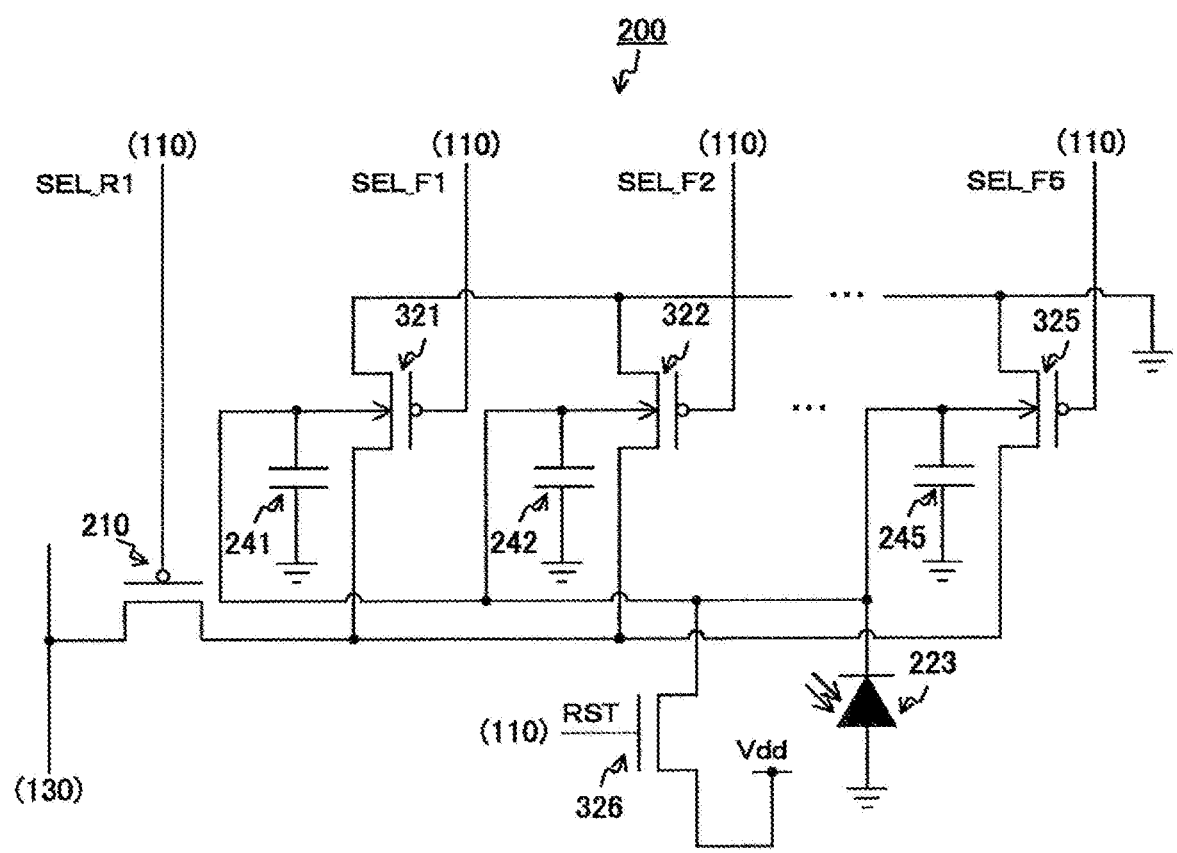
FIG. 15 is an example of an equivalent circuit diagram illustrating the pixel circuit in the third embodiment.

FIG. 15 is an example equivalent circuit diagram illustrating the pixel circuit 200 in the third embodiment. The pixel circuit 200 in the third embodiment differs from that in the first embodiment in that it further includes a reset transistor 326. For example, an n-type MOS transistor is used as the reset transistor 326. The reset transistor 326 has a source connected to the floating diffusion layers 241 to 245, a gate electrode 256 into which the rest signal RST is input, and a drain 240 to which the power-supply potential Vdd is applied. The reset transistor 326 includes the p layer 260 illustrated in FIGS. 14A and 14B, the n+ layer 240, and the floating diffusion layers 241 to 245.

Example Operation of Imaging Device

Figure 16:
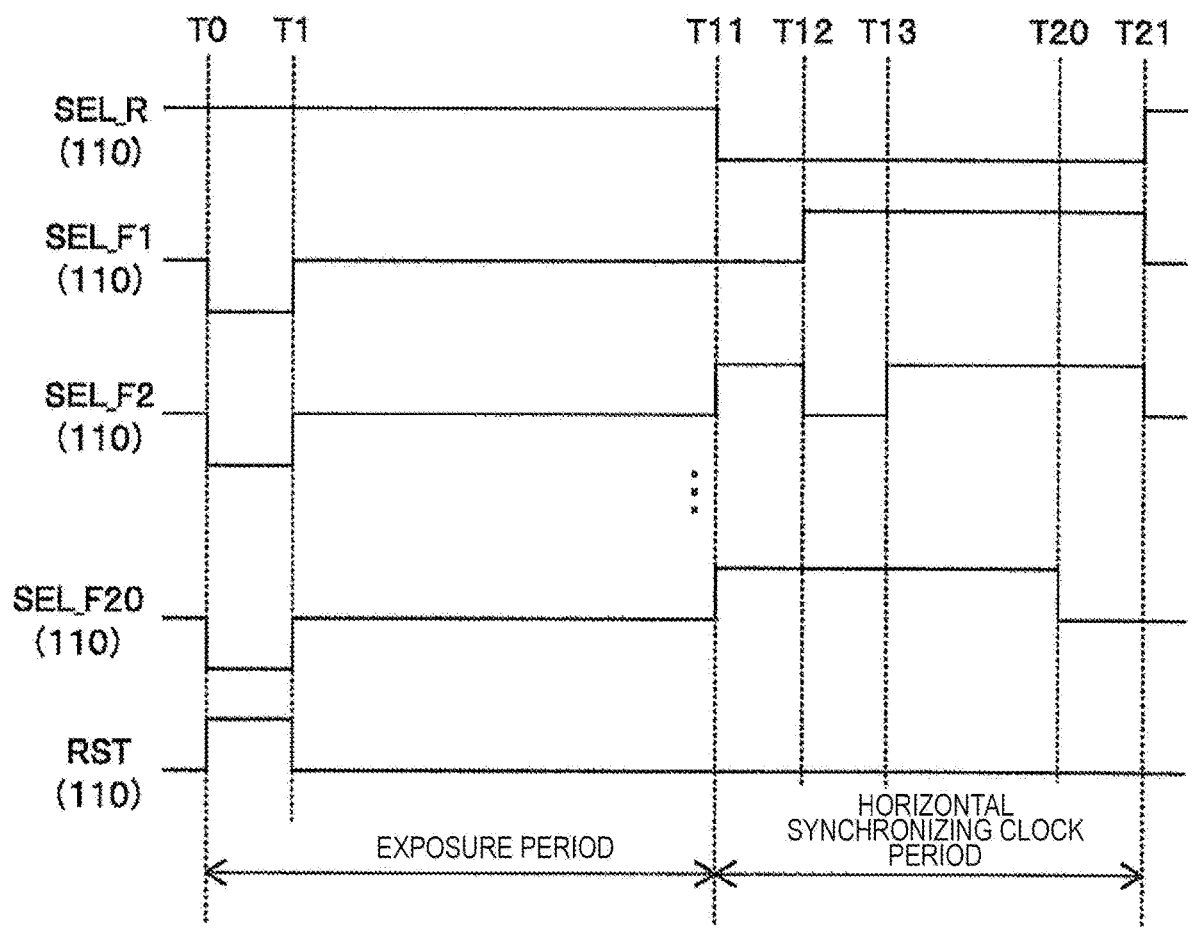
FIG. 16 is a timing chart illustrating one example of control of the pixel circuit in the third embodiment.

FIG. 16 is a timing chart illustrating one example of control of the pixel circuit 200 in the third embodiment.

Control of the row selection signal SEL_R1 and FD selection signals SEL_F1 to SEL_F20 in the third embodiment is similar to that in the first embodiment.

The rest signal RST is set to the high level by the row scanning circuit 110 in duration from the timing T0 at the timing of starting exposure to the timing T1, and is set to the low level after the timing T1. This resets all the floating diffusion layers at the time of starting exposure.

The third embodiment has a configuration in which three-value-driven transistors are used as the amplifying transistors 321 to 325. However, two-value-driven transistors may be uses as the amplifying transistors 321 to 325. In this case, for example, the amplifying transistors 321 to 325 enter an ON state in either case of cases where corresponding FD selection signals are in high level or low level, and enters an OFF state in the other case.

As described above, according to the third embodiment, the imaging device 100 can completely deplete the floating diffusion layers because it includes a reset transistor for releasing stored charge.

"Modification"

In the third embodiment, an imaging device 100 in which amplifying transistors are connected in parallel further includes a reset transistor. However, the imaging device 100, in which amplifying transistors are connected in series, may include a reset transistor. The imaging device 100 in a modification differs from that in the third embodiment in that amplifying transistors are connected in series.

Example Configuration of Pixel Circuit

Figure 17:
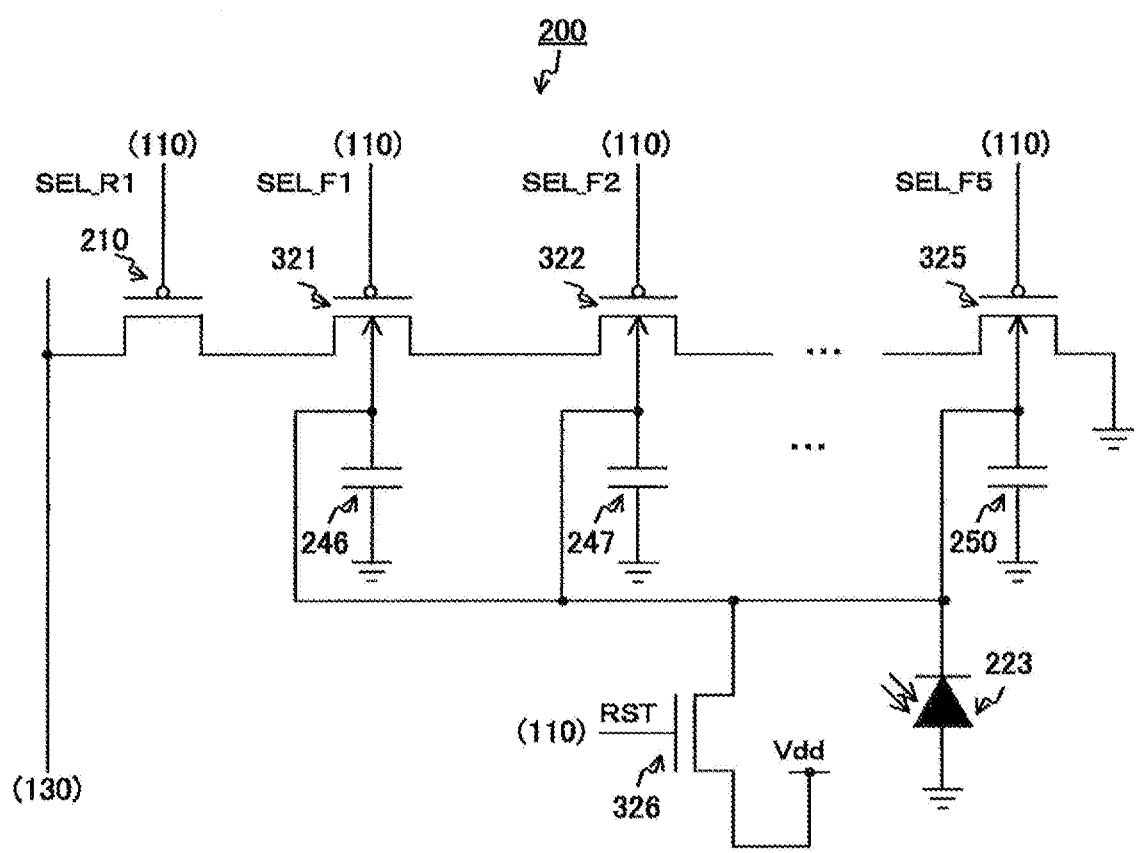
FIG. 17 is an example of an equivalent circuit diagram illustrating a pixel circuit in a modification of the third embodiment.

FIG. 17 is an example equivalent circuit diagram illustrating the pixel circuit 200 in the modification of the third embodiment. The equivalent circuit of the pixel circuit 200 in the modification differs from that in the third embodiment in that the amplifying transistors 321 to 325 are connected in series.

Example Operation of Imaging Device

Figure 18:
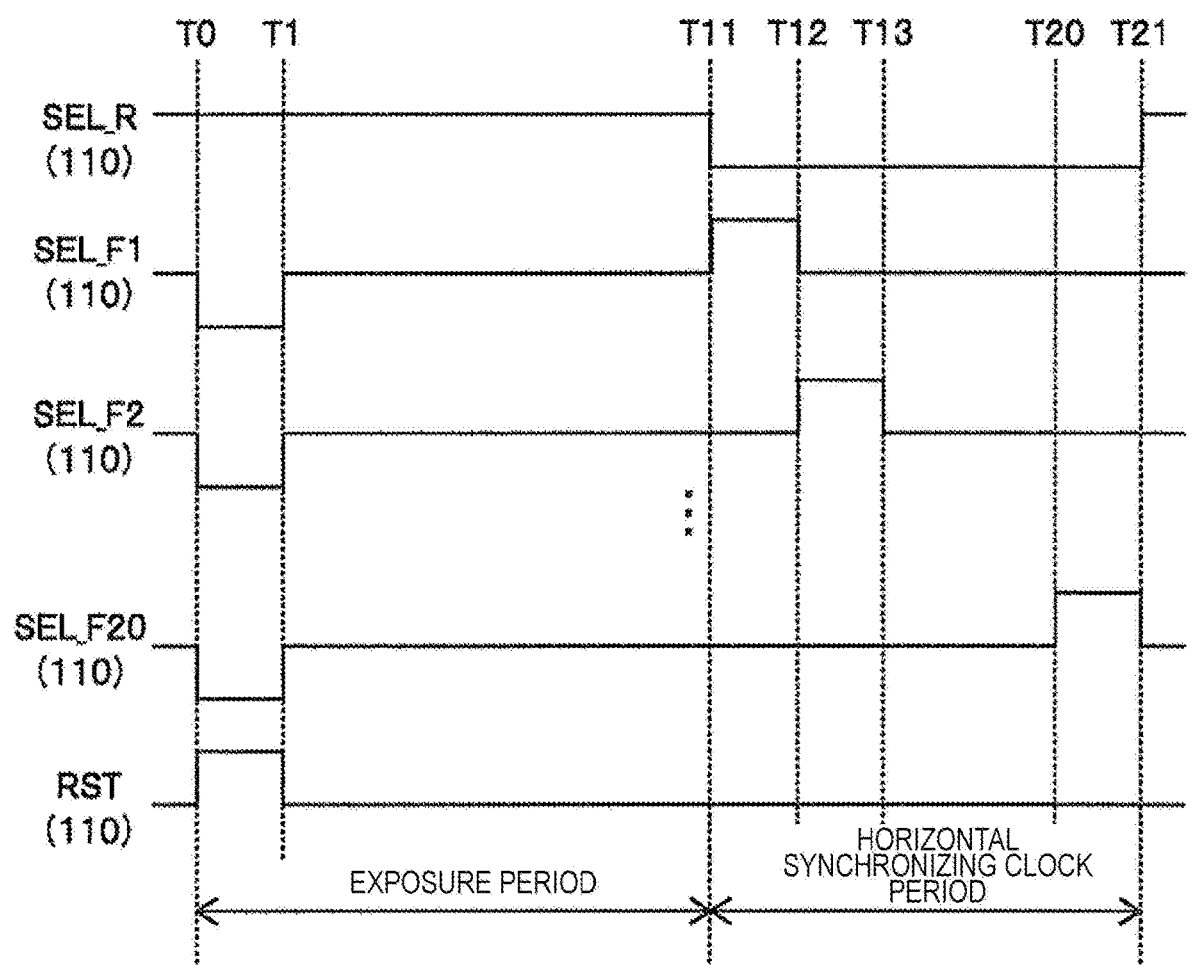
FIG. 18 is a timing chart illustrating one example of control of the pixel circuit in the modification of the third embodiment.

FIG. 18 is a timing chart illustrating one example of control of the pixel circuit 200 in the modification of the third embodiment. Control of the row selection signal SEL_R1 and FD selection signals SEL_F1 to SEL_F20 is similar to that in the second embodiment. Control of the rest signal RST is similar to that in the third embodiment.

As described above, according to the modification, since the reset transistor is formed in the imaging device 100 in which amplifying transistors are connected in series, a fine configuration is easily formed and the floating diffusion layers can completely be depleted.

4. Fourth Embodiment

Example Configuration of Pixel Circuit

In the first embodiment, the floating diffusion layers are isolated by forming an STI in the device isolation region 270. An imaging device 100 in a fourth embodiment of the present technology differs from that in the first embodiment in that an electrode is embedded in the device isolation region 270, with an isolation layer provided therebetween.

Figure 19:
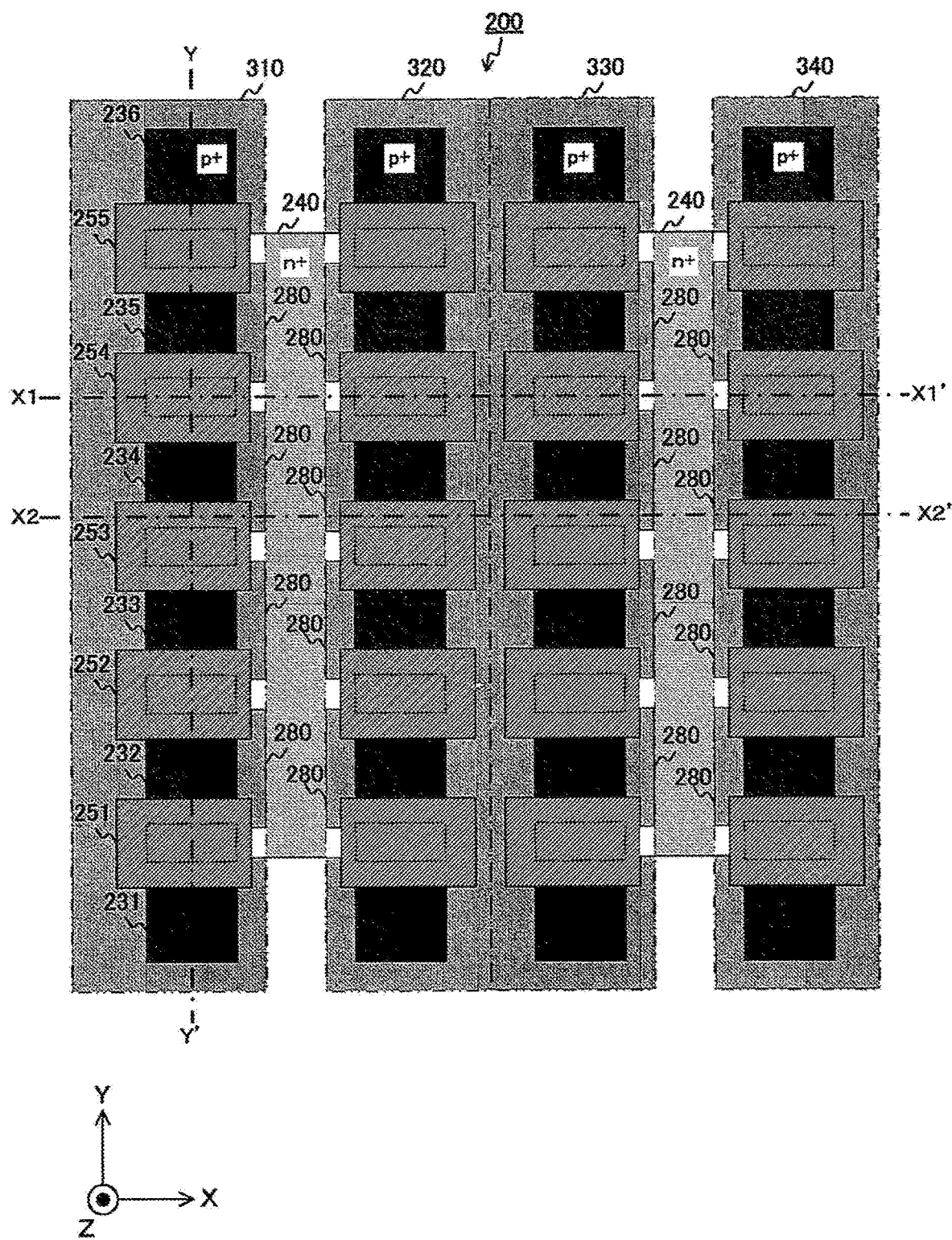
FIG. 19 is an example plan view illustrating a pixel circuit in a fourth embodiment of the present technology.

FIG. 19 is an example plan view illustrating the pixel circuit 200 in the fourth embodiment. The pixel circuit 200 in the fourth embodiment differs from that in the first embodiment in that a device isolation region 280 is provided instead of the device isolation region 270. The device isolation region 280 is a region in which an electrode is embedded with a silicon dioxide (SiO2) isolation layer or the like provided therebetween.

Figure 20A:
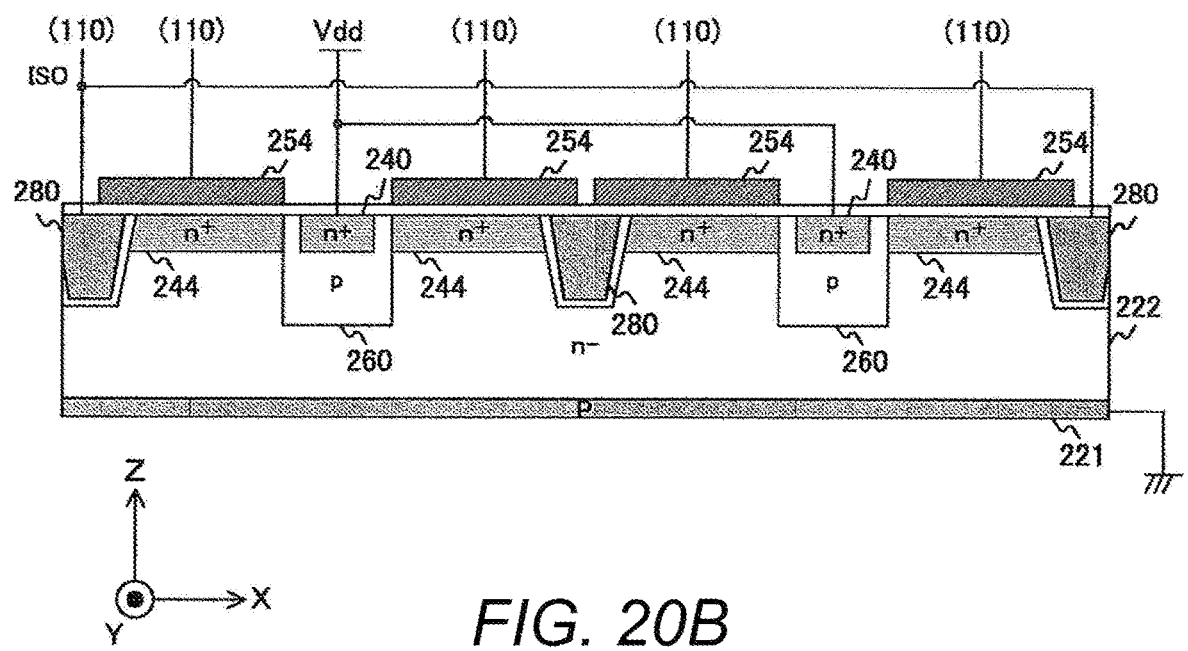
FIGS. 20A and 20B are examples of horizontally sectional views illustrating the pixel circuit in the fourth embodiment.
Figure 20B:
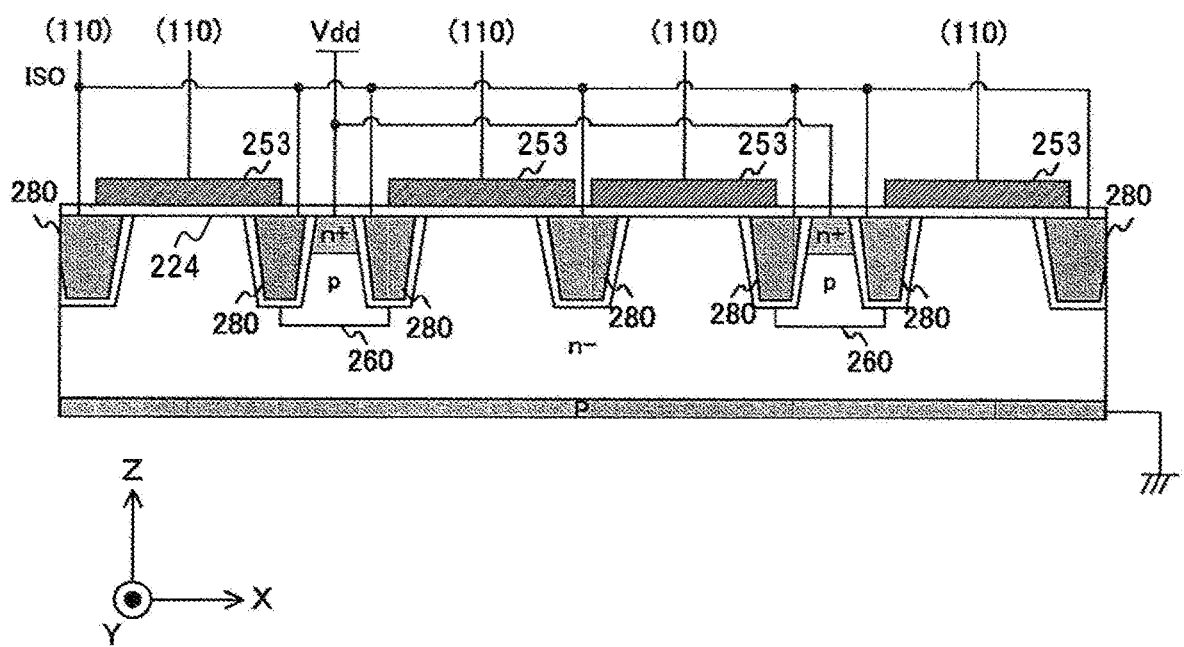

FIGS. 20A and 20B are examples of horizontally (X axial) sectional views illustrating the pixel circuit 200 in the fourth embodiment. FIG. 20A is an example sectional view, taken along line X1-X1' in FIG. 19, illustrating the pixel circuit 200. FIG. 20B is an example sectional view, taken along line X2-X2' illustrated in FIG. 19, illustrating the pixel circuit 200. As illustrated in FIGS. 20A and 20B, in the device isolation region 280, an electrode is embedded with an isolation layer provided therebetween. In addition, a device isolation control signal ISO generated by the row scanning circuit 110 is input to the device isolation region 280. The device isolation control signal ISO is a signal that determines whether or not a region facing the device isolation region 280 is to be in pinning state. For example, when the region facing the device isolation region 280 is to be in pinning state, the device isolation control signal ISO is set to the low level (e.g., negative bias), and when the region facing the device isolation region 280 is not in pinning state, the device isolation control signal ISO is set to the high level (e.g., the ground).

When the device isolation control signal ISO is in low level, the device isolation region 280 enters the pining state in which the Fermi potential is fixed. This causes a region facing the device isolation region 280 to be in pining state, whereby a dark current due to defects around the device isolation region and occurrence of a white point can be suppressed. On the other hand, when the device isolation control signal ISO is in high level, the pinning state is released.

Example Operation of Imaging Device

Figure 21:
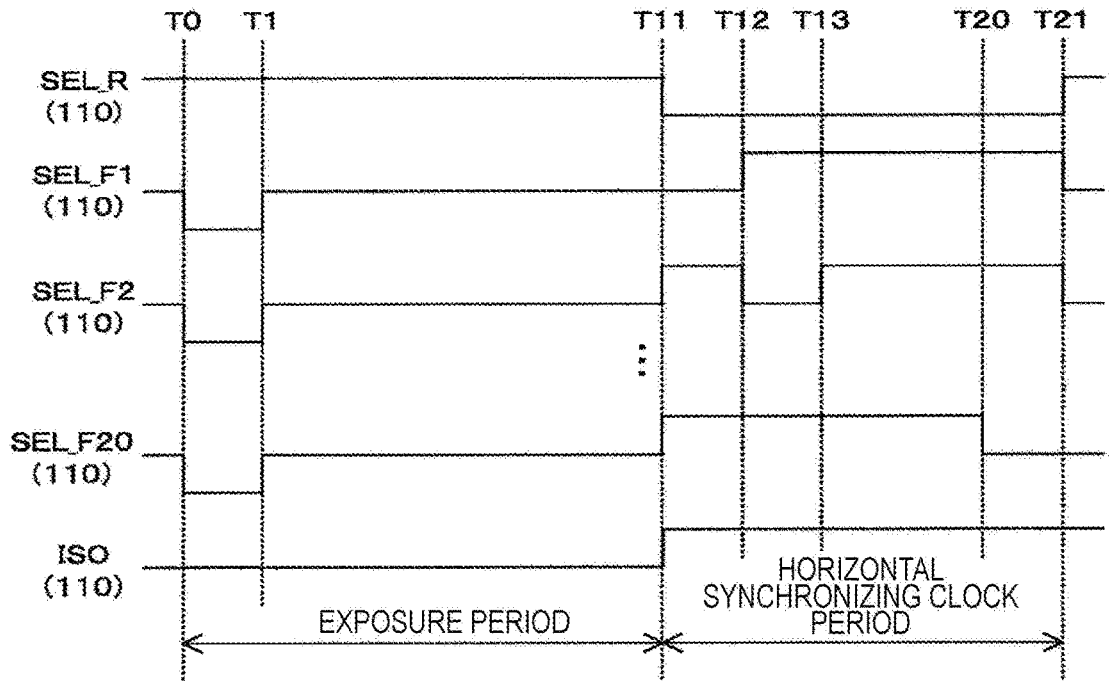
FIG. 21 is a timing chart illustrating one example of control of the pixel circuit in the fourth embodiment.

FIG. 21 is a timing chart illustrating one example of control of the pixel circuit 200 in a fourth embodiment of the present technology. Control of a row selection signal SEL_R1 and FD selection signals SEL_F1 to SEL_F20 is similar to that in the first embodiment.

The device isolation control signal ISO is set to the low level in an exposure period from timings T0 to T11. This causes the region facing the device isolation region 280 to be in pinning state while charge is being stored, whereby a dark current due to defects around the device isolation region and occurrence of a white point can be suppressed. Note that setting of the region facing the device isolation region 280 to the pinning state may be avoided during a reading period because the region facing the device isolation region 280 in pinning state during the reading period serves as a leak path for an amplifying transistor. Accordingly, at timing T11 at which reading starts, and thereafter, the device isolation control signal ISO is set to the high level.

As described above, according to the fourth embodiment, only in the exposure period, the region facing the device isolation region 280 enters the pinning state. Thus, a dark current due to defects around the device isolation region and occurrence of a white point can be suppressed.

"Modification"

Although in the fourth embodiment, a device separation region is provided in the imaging device 100, in which amplifying transistors are connected in parallel, the device separation region may be provided in the imaging device 100, in which amplifying transistors are connected in series. The imaging device according to a modification differs from that in the fourth embodiment in that the amplifying transistors are connected in series.

Example Operation of Imaging Device

Figure 22:
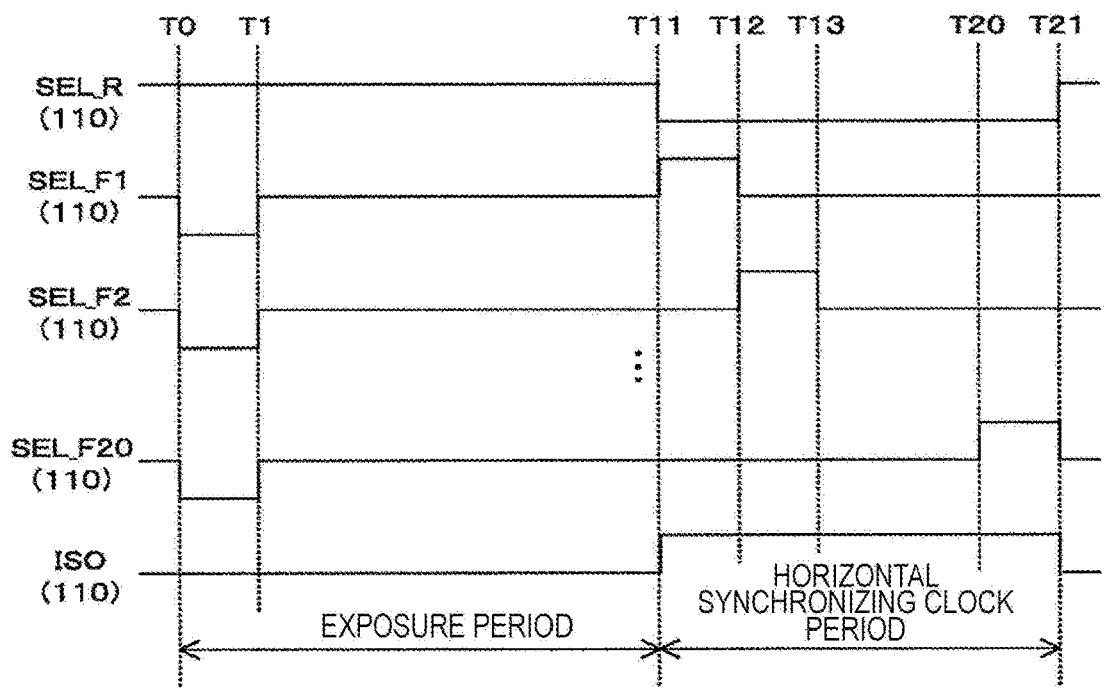
FIG. 22 is a timing chart illustrating one example of control of a pixel circuit in a modification of the fourth embodiment.

FIG. 22 is a timing chart illustrating one example of control of a pixel circuit 200 in the modification of the fourth embodiment. Control of a row selection signal SEL_R1 and FD selection signals SEL_F1 to SEL_F20 in the modification is similar to that in the second embodiment. Control of a device isolation control signal ISO is similar to that in the fourth embodiment.

As described above, according to the modification, a device separation region is provided in the imaging device 100 in which amplifying transistors are connected in series. Thus, formation of a fine configuration is facilitated. In addition, only in an exposure period, a region facing the device isolation region 280 enters the pinning state, whereby a chug(current due to defects around the device isolation region and occurrence of a white point can be suppressed.

5. Fifth Embodiment

Example Configuration of Pixel Circuit

In the fourth embodiment, the device isolation region 280 is formed avoiding a connection portion between an n+ layer 240 and a floating diffusion layer in one FD column. However, it is easier to form the device isolation region by providing the device isolation region 280 without avoiding the connection portion between the n+ layer 240 and the floating diffusion layer. An imaging device 100 in a fifth embodiment of the present technology differs from that in the fourth embodiment in that the device isolation region 280 is provided without avoiding the connection portion between the n+ layer 240 and the floating diffusion layer.

Figure 23:
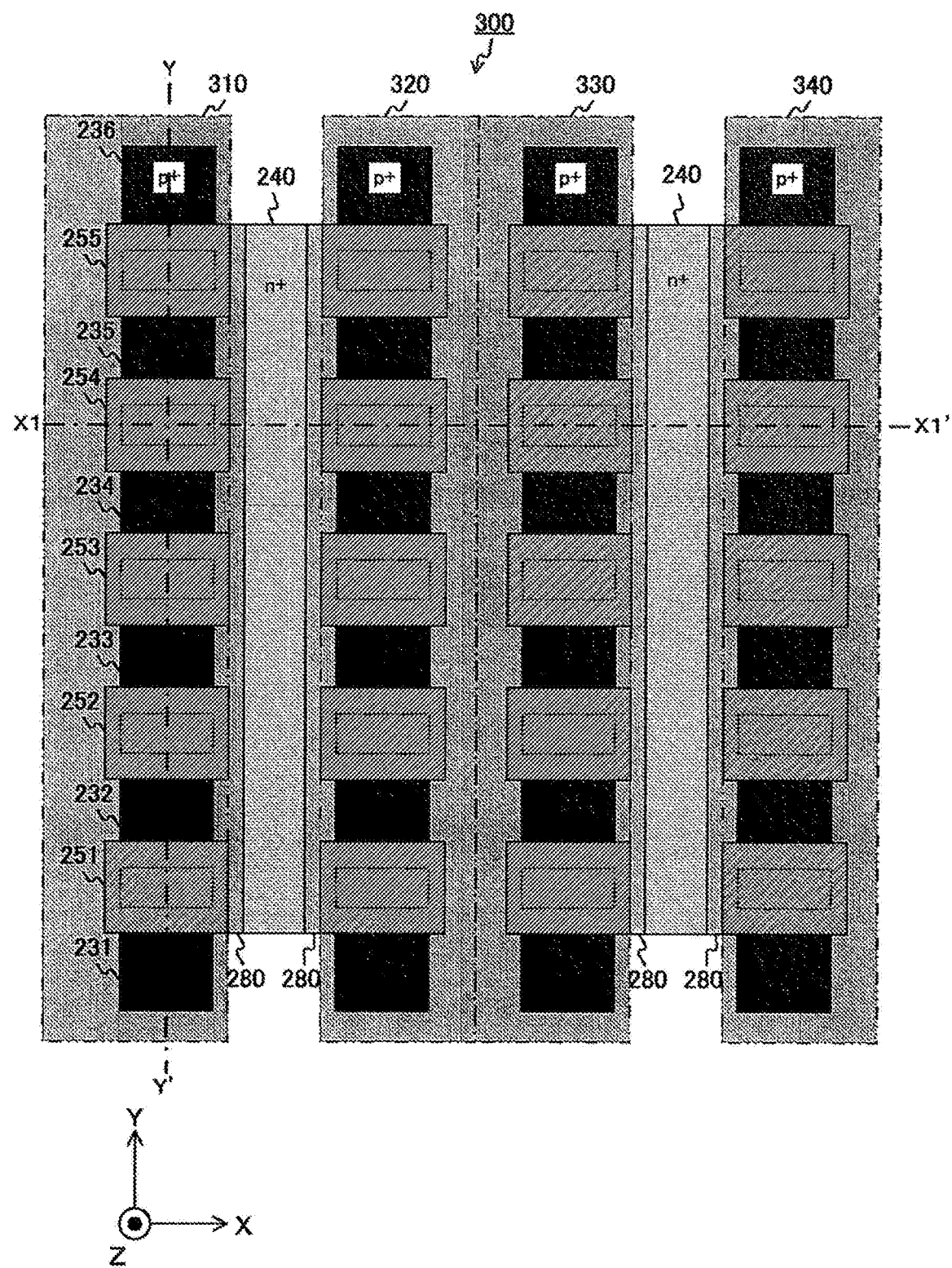
FIG. 23 is an example plan view illustrating a pixel circuit in a fifth embodiment of the present technology.

FIG. 23 is an example plan view illustrating a pixel circuit 200 in the fifth embodiment. A pixel circuit 200 in the fifth embodiment differs from that in the fourth embodiment in that the device isolation region 280 is provided, including the connection portion between the n+ layer 240 and the floating diffusion layer, between each of the FD columns 310, 320, 330, and 340, and each n+ layer 240.

Figure 24:
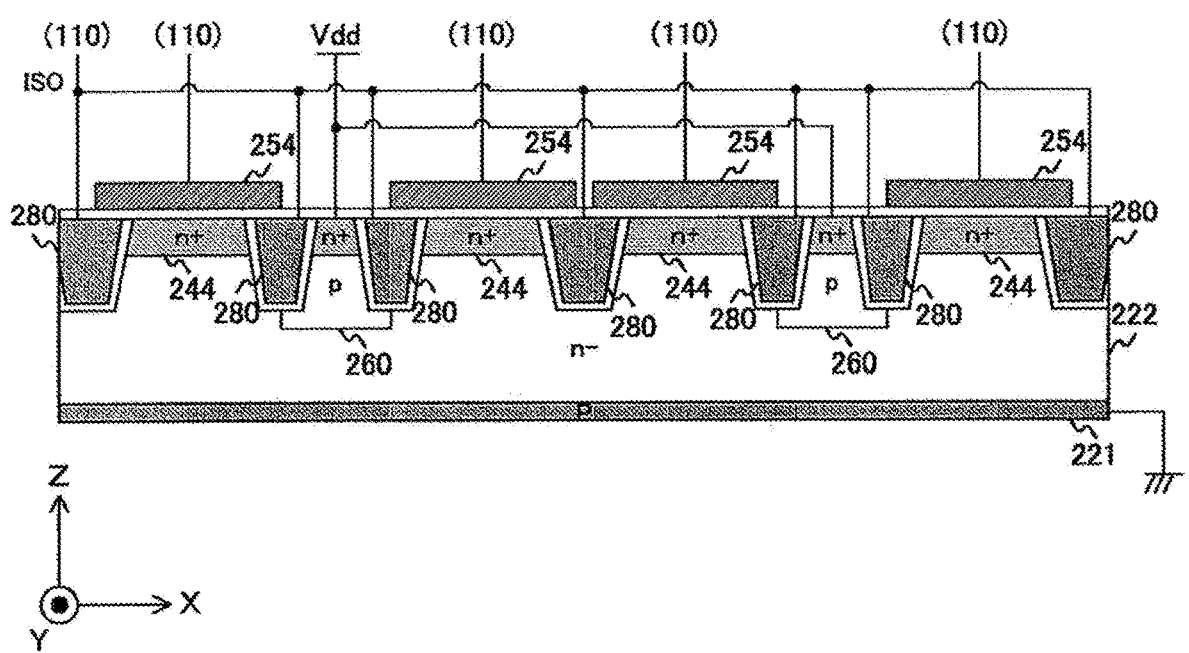
FIG. 24 is an example of a horizontally sectional view illustrating the pixel circuit in the fifth embodiment.

FIG. 24 is an example of a horizontally (X axial) sectional view illustrating the pixel circuit 200 in the fifth embodiment. FIG. 24 is a sectional view, taken along line X1-X1' in FIG. 23, illustrating the pixel circuit 200. As illustrated in FIG. 24, each device isolation region 280 is provided between each n+ layer 240 and each floating diffusion layer 244. However, if the n+ layer 240 and the floating diffusion layer 244 continuously remain separated, charge stored in the floating diffusion layer 244 is not released to the n+ layer 240. Therefore, at the time of resetting, it is necessary to cancel the insulation state of the device isolation region 280.

Example Operation of Imaging Device

Figure 25:
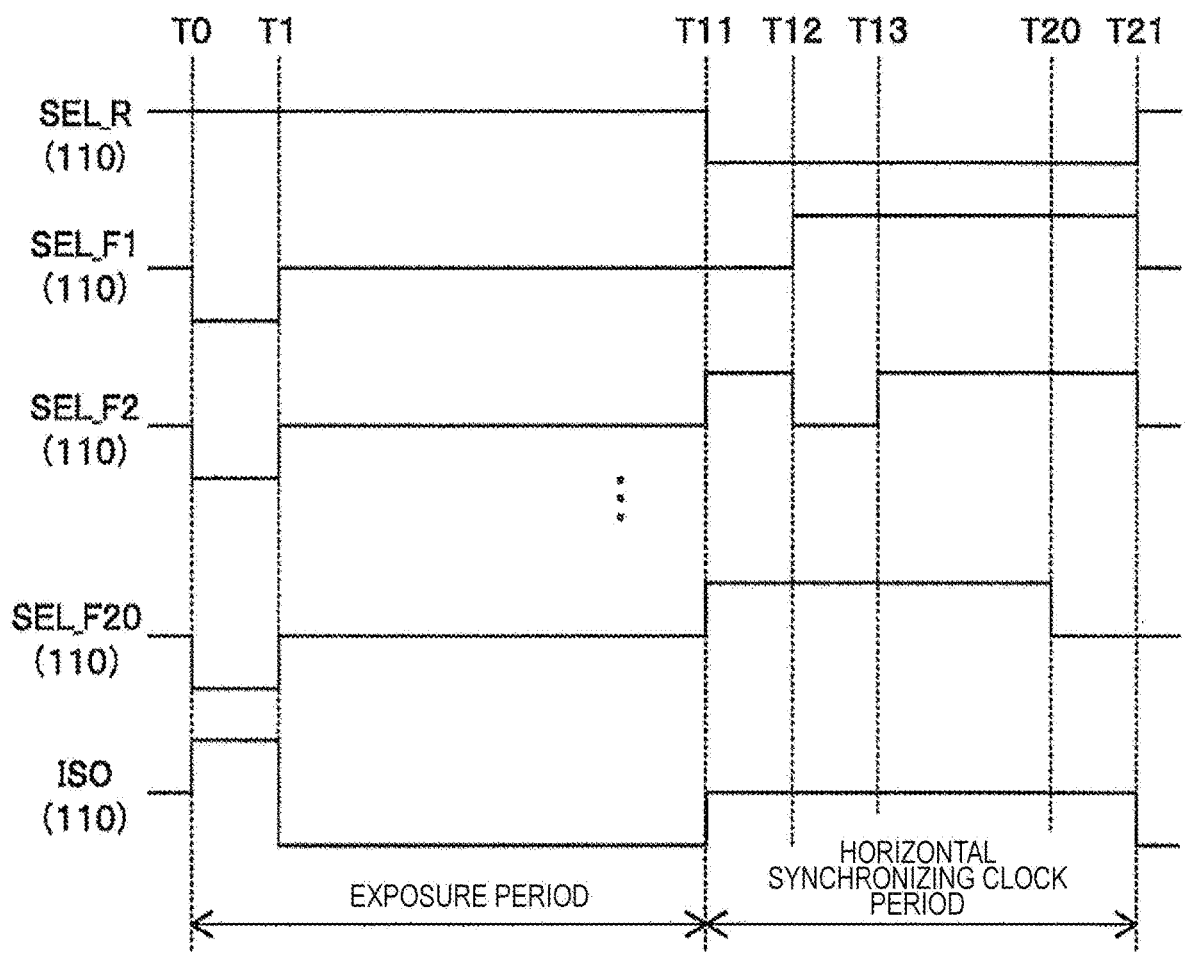
FIG. 25 is a timing chart illustrating one example of control of the pixel circuit in the fifth embodiment.

FIG. 25 is a timing chart illustrating one example of control of the pixel circuit 200 in the fifth embodiment. A device isolation control signal ISO in the fifth embodiment is set to the high level in duration between timings T0 to T1 at the start of exposure. This causes the device isolation region 280 to function as a vertical transistor, whereby charge stored in the floating diffusion layer is released to the n+ layer 240 via the device isolation region 280.

In duration between timings T1 to T11, the device isolation control signal ISO is set to the low level, and at timing T11 and thereafter, it is set to the middle level.

As described above, according to the fifth embodiment, in the imaging device 100, in order that the insulation state of the device isolation region 280 may be canceled at the time of resetting, the device isolation region 280 can be provided without avoiding the connection portion between the n+ layer 240 and the floating diffusion layer.

"Modification"

Although in the fifth embodiment, the device isolation region 280 is provided in the imaging device 100, in which amplifying transistors are connected in parallel, the device isolation region 280 may be provided in the imaging device 100, in which amplifying transistors are connected in series. The imaging device 100 in a modification differs from that in the fifth embodiment in that amplifying transistors are connected in series.

Example Operation of Imaging Device

Figure 26:
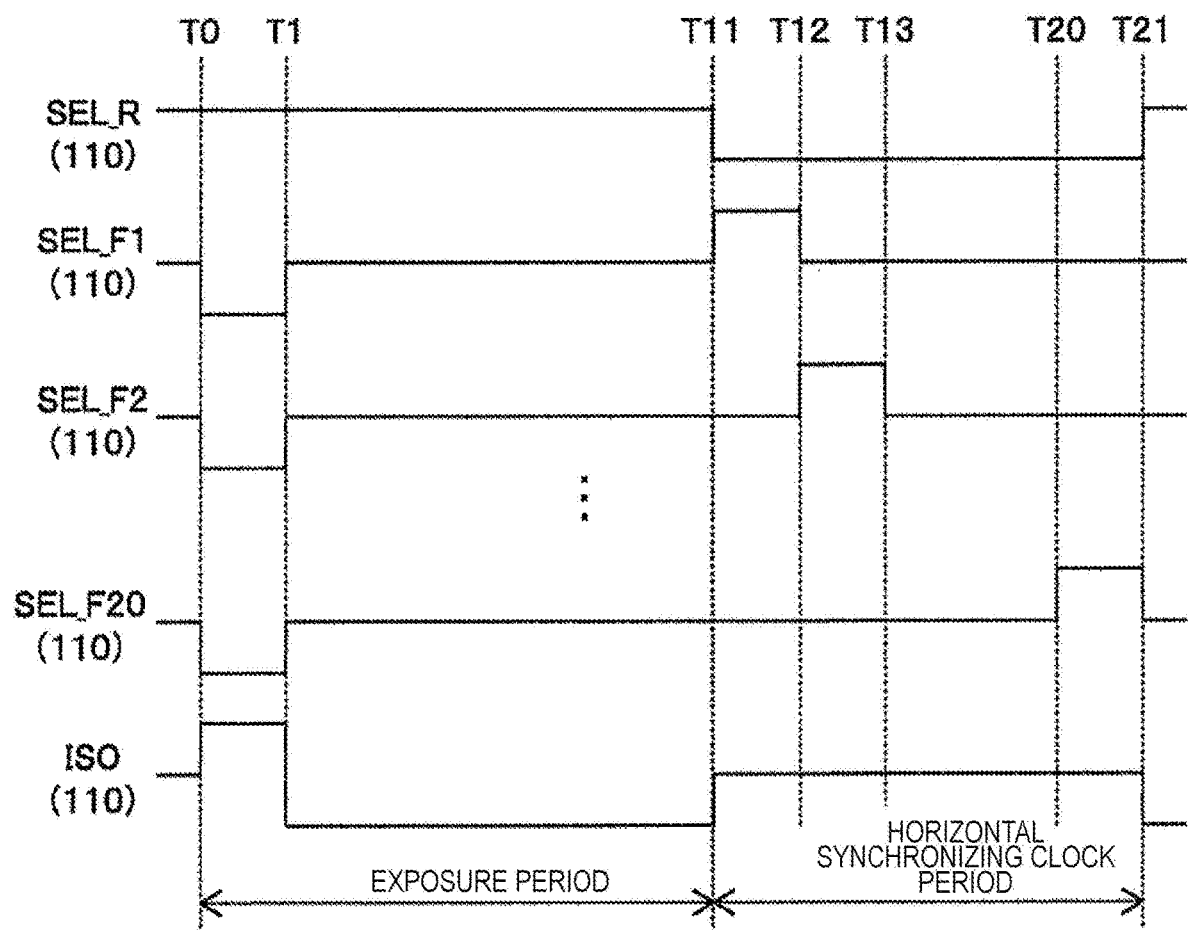
FIG. 26 is a timing chart illustrating one example of control of the pixel circuit in a modification of the fifth embodiment.

FIG. 26 is a timing chart illustrating one example of control of the pixel circuit 200 in the modification of the fifth embodiment. Control of the row selection signal SEL_R1 and the FD selection signals SEL_F1 to SEL_F20 in the modification is similar to that in the second embodiment. Control of the device isolation control signal ISO in the modification is similar to that in the fifth embodiment.

As described above, according to the modification, in the imaging device 100, in which amplifying transistors are connected in series, the device isolation region 280 functions as a vertical transistor at the time of resetting. Thus, formation of a fine configuration is facilitated. In addition, the device isolation region 280 can be provided without avoiding the connection portion to the floating diffusion layer.

The above-described embodiments each are an example of realizing the present technology, and that particulars in the embodiments and particulars specifying the present technology in the appended claims have respective correspondences. Similarly, the particulars specifying the present technology, and particulars having names identical thereto in the embodiments of the present technology have respective correspondences. Note that the present technology is not limited to the embodiments, and can be embodied by variously modifying the embodiments without departing from the gist of the present technology.

The processing procedure described in the above-described embodiments may be regarded as a method having a series of steps. In addition, the processing procedure may be regarded as a program for causing a computer to execute the series of steps or as a recording medium with the program recorded therein. Types of the recording medium include, for example, compact discs (CDs), mini discs (MDs), digital versatile discs (DVDs), memory cards, and Blu-ray (registered trademark) discs.

The present technology may also have the following configuration:

(1) A pixel circuit comprising:
a floating diffusion layer of a first conductivity-type between a drain/source of a second conductivity-type and a source/drain of the second conductivity-type, said source/drain and said drain/source touching said floating diffusion layer;
a cathode of a photoelectric converter electrically connected to said floating diffusion layer, said cathode being of said first conductivity-type;
an anode of the photoelectric converter touching said cathode, said anode being of said second conductivity-type.

(2) The pixel circuit according to (1), wherein said cathode touches said floating diffusion layer.

(3) The pixel circuit according to (1), wherein said cathode is between said floating diffusion layer and said anode.

(4) The pixel circuit according to (1), further comprising:
a different floating diffusion layer of the first conductivity-type directly electrically connected to said cathode.

(5) The pixel circuit according to (4), wherein said different floating diffusion layer is between a different drain/source of the second conductivity-type and said source/drain.

(6) The pixel circuit according to (5), wherein said source/drain and said different drain/source touch said different floating diffusion layer.

(7) The pixel circuit according to (5), further comprising:
a source of a selection transistor electrically connected to said drain/source.

(8) The pixel circuit according to (7), wherein said source of the selection transistor is electrically connected to said different drain/source.

(9) The pixel circuit according to (7), further comprising:
a drain of the selection transistor electrically connected to a signal line.

(10) The pixel circuit according to (4), further comprising:
a gate insulation film between said floating diffusion layer and a gate electrode.

(11) The pixel circuit according to (10), wherein said gate insulation film is between said floating diffusion layer and a different gate electrode.

(12) The pixel circuit according to (1), wherein said anode is configured to receive light, said photoelectric converter being configured to convert said light into an electric charge.

(13) The pixel circuit according to (1), further comprising:
a first layer of the first conductivity-type in a second layer of the second conductivity-type, said second layer being between said floating diffusion layer and another floating diffusion layer of the first conductivity-type.

(14) The pixel circuit according to (1), further comprising:
a reset transistor controllable to provide electrical connection and disconnection between said floating diffusion layer and a power-supply potential.

(15) The pixel circuit according to (1), wherein said first conductivity-type is of a conductivity opposite to said second conductivity-type.

(16) The pixel circuit according to (1), wherein said first conductivity-type is n-type.

(17) The pixel circuit according to (1), wherein said second conductivity-type is p-type.

(18) The pixel circuit according to (1), wherein an impurity concentration of the first conductivity-type in said floating diffusion layer is higher than an impurity concentration of the first conductivity-type in said cathode.

(19) The pixel circuit according to (1), wherein an impurity concentration of the second conductivity-type in said source/drain is higher than an impurity concentration of the second conductivity-type in said anode.

(20) The pixel circuit according to (19), wherein said impurity concentration of the second conductivity-type in said anode is lower than an impurity concentration of the second conductivity-type in said drain/source.

(21) An imaging device including a plurality of pixels, the plurality of pixels each including:
a photoelectric converter that converts incident light into charge;
a plurality of charge storage units that store the charge;
an amplifier that sequentially amplifies and outputs signal voltages according to amounts of the charge stored in the plurality of charge storage units.

(22) The imaging device according to (21),
wherein the amplifier includes a plurality of amplifying transistors that amplify and output the signal voltages respectively for the plurality of charge storage units; and the plurality of amplifying transistors is connected in series between a power-supply potential point and a reference potential point.

(23) The imaging device according to (21) or (22),
wherein the amplifier includes a plurality of amplifying transistors that amplify and output the signal voltages respectively for the plurality of charge storage units, and wherein the amplifying transistors are connected in parallel between a power-supply potential point and a reference potential point.

(24) The imaging device according to any of (21) to (23),
wherein the amplifier includes a plurality of amplifying transistors that amplify and output the signal voltages respectively for the plurality of charge storage units, wherein each amplifying transistor of the plurality of amplifying transistors causes the charge stored in a corresponding one of the plurality of charge storage units to be released when a control signal for controlling the amplifying transistor is in a first potential, amplifies and outputs a corresponding one signal voltage of the signal voltages when the control signal is at a second potential, and does not output the corresponding one signal voltage when the control single is at a third potential.

(25) The imaging device according to any of (21) to (24), further including a reset transistor that causes the charge stored in the plurality of charge storage units to be released.

(26) The imaging device according to the any of (21) to (25),
wherein the amplifier includes a plurality of amplifying transistors that amplify and output the signal voltages respectively for the plurality of charge storage units, wherein each of the amplifying transistors includes a gate, a source, and a drain, and wherein each charge storage unit of the plurality of charge storage units is formed between the source and the drain of a corresponding one of the plurality of amplifying transistors for the charge storage unit.

(27) The imaging device according to any of (21) to (26), further including:
a device separation region that enters a conduction state in a predetermined conduction period and that enters a non-conduction state in a non-conduction period which does not fall into the conduction state; and a charge releasing layer connected to the plurality of charge storage units via the device separation region, wherein the plurality of charge storage units release the stored charge to the charge releasing layer via the device separation region in the conduction period.

(28) The imaging device according to any of (21) to (27), further including a plurality of adders that respectively add up the output signal voltages to generate a resulting sum.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

100 Imaging device
110 Row scanning circuit
120 Image array section
130 A/D converter
140 Integrating circuit
145 Determining circuit
150 Register
160 Output circuit
200 Pixel circuit
210 Row selection transistor
221, 260 p layer
222 n− layer
223 Photoelectric converter
224 Gate insulation film
231, 232, 233, 234, 235, 236 p+ layer
240 n+ layer
241, 242, 243, 244, 245 Floating diffusion layer
251, 252, 253, 254, 255 Gate electrode
256, 258 Reset gate electrode
270, 280 Device isolation region
310, 320, 330, 340 FD column
321, 322, 323, 324, 325 Amplifying transistor

The invention claimed is:

1. An imaging device comprising:
a plurality of pixels, the plurality of pixels including:
a photoelectric converter that converts incident light into a charge;
a plurality of charge storage units that store the charge; and
a plurality of amplifying transistors that sequentially amplify and output signal voltages respectively for the plurality of charge storage units according to amounts of charge stored in each of the plurality of charge storage units, wherein the plurality of amplifying transistors are all connected in parallel between a power-supply potential point and a reference potential point.

2. The imaging device of claim 1, wherein each amplifying transistor of the plurality of amplifying transistors causes the charge stored in a corresponding one of the plurality of charge storage units to be released when a control signal for controlling the amplifying transistor is in a first potential, amplifies and outputs a corresponding one signal voltage of the signal voltages when the control signal is at a second potential, and does not output the corresponding one signal voltage when the control signal is at a third potential.

3. The imaging device of claim 1, further comprising:
a reset transistor that causes the charge stored in the plurality of charge storage units to be released.

4. The imaging of claim 1, wherein each amplifying transistor of the plurality of amplifying transistors includes a gate, a source, and a drain, and wherein each charge storage unit of the plurality of charge storage units is formed between the source and the drain of a corresponding one of the plurality of amplifying transistors for the charge storage unit.

5. The imaging of claim 1, further comprising:
a device separation region that enters a conduction state in a predetermined conduction period and that enters a non-conduction state in a non-conduction period which does not fall into the conduction state; and
a charge releasing layer connected to the plurality of charge storage units via the device separation region, wherein the plurality of charge storage units releases the stored charge to the charge releasing layer via the device separation region in the conduction period.

6. The imaging of claim 1, further comprising:
a plurality of adders that respectively add up the output signal voltages to generate a resulting sum.

* * * * *